(12) United States Patent
Higuchi

(10) Patent No.: US 6,765,423 B2
(45) Date of Patent: Jul. 20, 2004

(54) SEMICONDUCTOR CIRCUIT HAVING CLOCK SYNCHRONOUS RECEIVER CIRCUIT

(75) Inventor: Tsuyoshi Higuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/259,775

(22) Filed: Sep. 30, 2002

(65) Prior Publication Data

US 2003/0184354 A1 Oct. 2, 2003

(30) Foreign Application Priority Data

Mar. 26, 2002 (JP) ........................................ 2002-086344

(51) Int. Cl.[7] ............................................. H03H 11/26
(52) U.S. Cl. ...................................... 327/270; 327/276
(58) Field of Search ................................ 327/149, 158, 327/161, 270–271, 276–277, 284, 141, 152, 153, 155

(56) References Cited

U.S. PATENT DOCUMENTS 6,489,822 B2 * 12/2002 Han ............................ 327/158
6,556,488 B2 * 4/2003 Han ............................ 365/194
6,587,534 B2 * 7/2003 Hassoun et al. ............. 375/376

FOREIGN PATENT DOCUMENTS

JP          10-228449         8/1998

* cited by examiner

Primary Examiner—My-Trang Nu Ton
(74) Attorney, Agent, or Firm—Arent, Fox, PLLC.

(57) ABSTRACT

A variable delay circuit delays a first input signal in accordance with a delay adjustment signal and outputs the delayed signal as a first delay signal. A decision circuit outputs, in accordance with a phase difference between the first delay signal and a clock signal, an increase or decrease signal. A delay adjustment circuit generates, in accordance with the increase or decrease signal, the delay adjustment signal to adjust the variable delay circuit. Accordingly, even when a discrepancy in timing between the first input signal and clock signal occurs due to a change in temperature, a fluctuation in voltage or the like, a first receiver circuit can receive the first input signal in synchronization with the clock signal without fail. Since the valid period of the first input signal relative to the clock signal can be minimized, the transmission rate of the first input signal can be increased.

16 Claims, 27 Drawing Sheets

SEMICONDUCTOR CIRCUIT HAVING CLOCK SYNCHRONOUS RECEIVER CIRCUIT

BACKGROUND OF THE INVENTION

1. Field of the Invention

The present invention relates to a semiconductor integrated circuit having receiver circuits that receive input signals in synchronization with a clock signal.

2. Description of the Related Art

In general, the semiconductor integrated circuit constituting a system operates in synchronization with a clock signal. This kind of system usually utilizes a single clock signal as the system clock for simplification of system design. The semiconductor integrated circuit in the system receives multiple-bit input signals in synchronization with the clock signal.

The timing of supplying the input signals to the semiconductor integrated circuit is defined by the setup and hold times relative to the clock signal. The setup time is a time required before a capturing edge of the clock signal, while the hold time is a time required after the capturing edge of the clock signal.

In semiconductor integrated circuits, the wire lengths are often made even so as to prevent a discrepancy from occurring between the timings of transmitting the multiple-bit data signals, address signals and so on (hereinafter referred to as "bus signals"). Also in the systems incorporating semiconductor integrated circuits, the wire lengths of the system bus lines are made even so as to prevent a discrepancy from occurring between the timings of the bus signals.

However, the timings of operations of the internal circuit of the semiconductor integrated circuit vary due to a change in temperature and a fluctuation in the supply voltage. Thus, even though the wire lengths of the signal lines have been made even, there may occur a discrepancy in timing between the bus signals transmitted within the semiconductor integrated circuit due to a change in temperature and a fluctuation in the supply voltage.

The setup and hold times of the input signals including the bus signals must be determined in view of the variation in the signal timings caused by a change in temperature and a fluctuation in the supply voltage as described above. Since this kind of timing variation is not dependent on the clock period, the higher the frequency of the clock signal is, relatively the larger the timing variation is. Accordingly, the higher the frequency of the clock signal is, relatively the longer the setup and hold times are. For this reason, in a system using the clock signal of high frequency, the frequency of the clock signal may be restricted by the setup and hold times. In other words, there may be a case that the transmission rate of the bus signals cannot be increased due to the restriction by the setup and hold times.

SUMMARY OF THE INVENTION

It is an object of the present invention to ensure that a semiconductor integrated circuit, which receives multiple-bit signals in synchronization with a clock signal, receives those signals without fail.

It is another object of the present invention to increase the transmission rate of the system constituted by the semiconductor integrated circuit.

According to one of the aspects of the semiconductor integrated circuit of the present invention, a first receiver circuit has a variable delay circuit, a decision circuit, and a delay adjustment circuit. The variable delay circuit delays a first input signal in accordance with a delay adjustment signal and outputs the delayed signal as a first delay signal. The decision circuit outputs, in accordance with a phase difference between the first delay signal and a clock signal, an increase signal to increase the delay time in the variable delay circuit or a decrease signal to decrease the delay time in the variable delay circuit. The delay adjustment circuit generates, in accordance with the increase or decrease signal, the delay adjustment signal to adjust the variable delay circuit.

For example, when the temperature of the semiconductor integrated circuit rises and the phase of the first input signal within the integrated circuit is delayed relative to the clock signal, the decision circuit outputs the decrease signal. The delay adjustment circuit generates the delay adjustment signal to shorten the delay time in the variable delay circuit. Thus, even when a discrepancy in timing between the first input signal and the clock signal occurs due to a change in temperature, a fluctuation in voltage or the like, the first receiver circuit can receive the first input signal without fail, in synchronization with the clock signal.

Since the timing of receiving the first input signal can be automatically adjusted within the first receiver circuit, the valid period (the setup and hold times) of the first input signal relative to the clock signal can be minimized. As a result, the frequency of the clock signal can be prevented from being restricted by the valid period, and the transmission rate of the first input signal can be increased.

In general, the input signals do not change in level as frequently as the clock signal. For this reason, the frequency of internal operations of the variable delay circuit that receives the first input signal is lower than the frequency of internal operations of the variable delay circuit that receives the clock signal. As a result, the power consumption in the variable delay circuit can be reduced.

According to another aspect of the semiconductor integrated circuit of the present invention, the decision circuit has a delay circuit, a level detecting circuit, and a delay-time control circuit. The delay circuit generates a standard delay signal obtained by delaying the first delay signal (or the first input signal) by a predetermined time, a previous delay signal whose phase is earlier than the phase of the standard delay signal, and a subsequent delay signal whose phase is later than the phase of the standard delay signal. The level detecting circuit detects, in synchronization with the clock signal (or the delay clock signal), an agreement or disagreement in logic level between the standard delay signal and the previous delay signal and an agreement or disagreement in logic level between the standard delay signal and the subsequent delay signal. When the first input signal deviates in timing from the clock signal, there occurs a disagreement in logic level between the standard delay signal and the previous or subsequent delay signal.

The delay-time control circuit outputs the increase signal when a logic level between the standard delay signal and the previous delay signal is in disagreement and outputs the decrease signal when a logic level between the standard delay signal and the subsequent delay signal is in disagreement. Then, the delay time of the first input signal is adjusted, and the first receiver circuit is prevented from receiving the first input signal of an incorrect level.

In this way, comparing the three signals of different timings (the previous, standard, and subsequent delay signals) in synchronization with the clock signal allows the timing deviation of the first input signal to be easily detected and the first input signal to resume the correct timing.

According to another aspect of the semiconductor integrated circuit of the present invention, the delay-time control circuit has an inhibiting circuit. The inhibiting circuit inhibits the increase and decrease signals from being outputted when both of the previous and subsequent delay signals disagree in logic level with the standard delay signal. If the valid period (timing specification) of the first input signal relative to the clock signal is short, there may occur a disagreement in level between the standard delay signal and the previous or subsequent delay signal even when the timing of the first input signal is correct. In such a case, the timing of the first input signal can be prevented from being erroneously adjusted.

According to another aspect of the semiconductor integrated circuit of the present invention, the decision circuit has a delay circuit, a level detecting circuit, and a delay-time control circuit. The delay circuit generates a standard delay signal obtained by delaying the first delay signal by a predetermined time, a plurality of previous delay signals whose phases are earlier than the phase of the standard delay signal, and a plurality of subsequent delay signals whose phases are later than the phase of the standard delay signal. The level detecting circuit detects, in synchronization with the clock signal, an agreement or disagreement in logic level between the standard delay signal and each of the previous delay signals and an agreement or disagreement in logic level between the standard delay signal and each of the subsequent delay signals.

The delay-time control circuit outputs the increase signal (s) when a logic level between the standard delay signal and any one of the previous delay signals is in disagreement and outputs the decrease signal(s) when a logic level between the standard delay signal and any one of the subsequent delay signals is in disagreement. Then, the delay time of the first input signal is adjusted, and the first receiver circuit is prevented from receiving the first input signal of the incorrect level.

Comparing the plurality of signals of different timings (the plurality of previous delay signals, the standard delay signal, and the plurality of subsequent delay signals) in synchronization with the clock signal allows the timing deviation of the first input signal to be easily detected even when it is small, or allows the range in which the timing deviation of the first input signal can be detected to be widened.

According to another aspect of the semiconductor integrated circuit of the present invention, the first receiver circuit has a mask circuit that outputs the delay adjustment signal generated by the delay adjustment circuit to the variable delay circuit every plurality of clock cycles. The adjustment frequency of delay time in the variable delay circuit can be reduced, thereby preventing the influence by jitter of the clock signal or the like.

According to another aspect of the semiconductor integrated circuit of the present invention, a second receiver circuit has a variable delay circuit and a second latch circuit. The variable delay circuit delays a second input signal in accordance with the delay adjustment signal generated by the delay adjustment circuit of the first receiver circuit and outputs the delayed signal as a second delay input signal. The second latch circuit latches the second delay input signal in synchronization with the clock signal and outputs the latched signal to an internal circuit. That is, the second receiver circuit receives the second input signal in synchronization with the clock signal, utilizing the decision circuit and delay adjustment circuit of the first receiver circuit. For this reason, the scale of the second receiver circuit can be reduced, and hence the chip size of the semiconductor integrated circuit can be reduced.

According to another aspect of the semiconductor integrated circuit of the present invention, a first receiver circuit has a variable delay circuit, a decision circuit, and a delay adjustment circuit. The variable delay circuit delays the clock signal in accordance with a delay adjustment signal and outputs the delayed signal as a delay clock signal. The decision circuit outputs, in accordance with a phase difference between the delay clock signal and the first input signal, an increase signal to increase the delay time in the variable delay circuit or a decrease signal to decrease the delay time in the variable delay circuit. The delay adjustment circuit generates, in accordance with the increase or decrease signal, the delay adjustment signal to adjust the variable delay circuit.

For example, when the temperature of the semiconductor integrated circuit rises and the phase of the clock signal within the integrated circuit is delayed relative to the first input signal, the decision circuit outputs the decrease signal. The delay adjustment circuit generates the delay adjustment signal to shorten the delay time in the variable delay circuit. Thus, even when a discrepancy in timing between the first input signal and the clock signal occurs due to a change in temperature, a fluctuation in voltage or the like, the first receiver circuit can receive the first input signal without fail, in synchronization with the clock signal.

Since the timing of receiving the first input signal can be automatically adjusted within the first receiver circuit, the valid period (the setup and hold times) of the first input signal relative to the clock signal can be minimized. As a result, the frequency of the clock signal can be prevented from being restricted by the valid period, and the transmission rate of the first input signal can be increased.

According to another aspect of the semiconductor integrated circuit of the present invention, the second receiver circuit has a second latch circuit. The second latch circuit latches the second input signal in synchronization with the delay clock signal generated by the variable delay circuit of the first receiver circuit, and outputs the latched signal to the internal circuit. That is, the second receiver circuit receives the second input signal in synchronization with the clock signal, utilizing the decision circuit, delay adjustment circuit, and variable delay circuit of the first receiver circuit. For this reason, the scale of the second receiver circuit can be reduced, and hence the chip size of the semiconductor integrated circuit can be reduced.

According to another aspect of the semiconductor integrated circuit of the present invention, a receiver circuit has a first variable delay circuit, a second variable delay circuit, a decision circuit, a first delay adjustment circuit, and a second delay adjustment circuit. The first variable delay circuit delays an input signal in accordance with a first delay adjustment signal. The second variable delay circuit delays, in accordance with a second delay adjustment signal, the input signal delayed by the first variable delay circuit and outputs the delayed signal as a first delay signal. That is, the first and second variable delay circuits are connected in series.

The decision circuit outputs, in accordance with a phase difference between the first delay signal and the clock signal, a first increase signal to increase the delay time in the first variable delay circuit or a first decrease signal to decrease the delay time in the first variable delay circuit. Also, the decision circuit outputs, in accordance with the phase difference between the first delay signal and the clock signal, a second increase signal to increase the delay time in the second variable delay circuit or a second decrease signal to decrease the delay time in the second variable delay circuit.

For example, the decision circuit outputs one of the first and second increase signals or one of the first and second decrease signals when the input signal slightly deviates in timing from the clock signal. The decision circuit outputs the first and second increase signals or the first and second decrease signals when the input signal largely deviates in timing from the clock signal.

The first delay adjustment circuit generates, in accordance with the first increase or first decrease signal, the first delay adjustment signal to adjust the first variable delay circuit. The second delay adjustment circuit generates, in accordance with the second increase or second decrease signal, the second delay adjustment signal to adjust the second variable delay circuit.

In this way, adjusting the delay time in at least one of the first and second variable delay circuits in accordance with the deviation amount of the input signal allows the timing of the input signal to be corrected in a short time period regardless of whether or not the deviation amount is large.

According to another aspect of the semiconductor integrated circuit of the present invention, the delay circuit has delay stages connected in cascade. The delay stages receive the first delay signal (or the first input signal) and sequentially generate the standard delay signal and the subsequent delay signal. The delay circuit outputs, as the previous delay signal, the first delay signal (or the first input signal) received by an initial delay stage among the delay stages. The delay time of the delay stages is set to the same value. That is, the phase difference between the standard and previous delay signals is equal to the phase difference between the standard and subsequent delay signals. This allows the circuits related to the previous delay signal to have the same configuration as the circuits related to the subsequent delay signal in the decision circuit. As a result, the circuit design and the timing design can be made easy.

According to another aspect of the semiconductor integrated circuit of the present invention, the decision circuit has a first latch circuit that latches the standard delay signal in synchronization with the clock signal (or the delay clock signal) and outputs the latched signal to the internal circuit. If a timing deviation of the first input signal occurs, it will be eliminated when a disagreement in level between the standard delay signal and the previous or subsequent delay signal is detected. Thus, the logic level of the standard delay signal will not be incorrect. Accordingly, the first receiver circuit can receive the first input signal without fail.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DETAILED DESCRIPTION OF THE PREFERRED EMBODIMENTS

Embodiments of the present invention will be described below with reference to the drawings.

Figure 1:
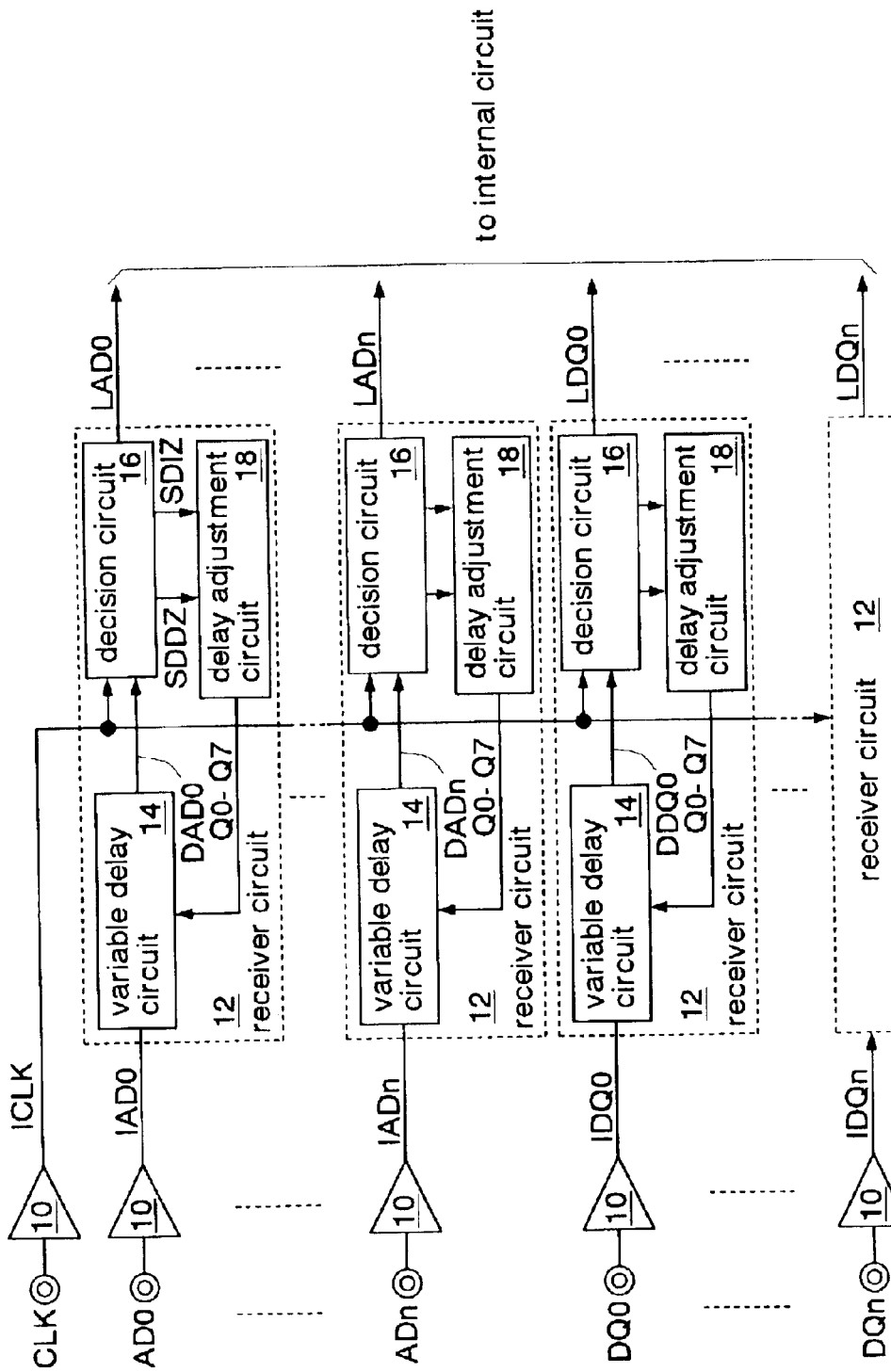
FIG. 1 is a block diagram showing a first embodiment of the present invention.

FIG. 1 illustrates a first embodiment of a semiconductor integrated circuit according to the present invention. This semiconductor integrated circuit is formed, as a DRAM, on a silicon substrate by use of a CMOS process.

The DRAM has input buffers 10 receiving a clock signal CLK, address signals AD0–ADn (first input signal), and data signals DQ0–DQn (first input signal) supplied via external terminals and also has receiver circuits 12 (first receiver circuit) corresponding to the address signals AD0–ADn and data signals DQ0–DQn, respectively. The DRAM also has other external terminals, which are not shown, for receiving command signals such as row address strobe signals, column address strobe signals, write enable signals and so on. Receiver circuits 12 are also formed for these command signals.

The input buffers 10, which have, for example, respective current mirror circuits, convert the voltage levels of the respective signals supplied via the external terminals into CMOS levels, and output them as an internal clock signal ILK, internal address signals IAD0–IADn, and internal data signals IDQ0–IDQn.

The receiver circuits 12 each have a variable delay circuit 14, a decision circuit 16, and a delay adjustment circuit 18. Since all of the receiver circuits 12 have the same structure, only the receiver circuit 12 corresponding to the address signal AD0 will be described hereafter.

The variable delay circuit 14 of the receiver circuit 12 adjusts the phase of the internal address signal IAD0 in accordance with delay adjustment signals Q0–Q7, and outputs the phase-adjusted signal as a delayed address signal DAD0 (first delay signal).

The decision circuit 16 compares the phase of the delayed address signal DAD0 with the phase of the internal clock signal ILK, decides whether to decrease or increase the delay time in the variable delay circuit 14, and outputs a decrease signal SDDZ or an increase signal SDIZ in accordance with the decision result. Also, the decision circuit 16 latches the internal address signal IAD0 in synchronization with the internal clock signal ILK, and outputs the latched signal as a latched address signal LAD0 to an internal circuit.

The delay adjustment circuit 18 changes the logic levels of the delay adjustment signals Q0–Q7 in accordance with the decrease signal SDDZ or increase signal SDIZ.

Figure 2:
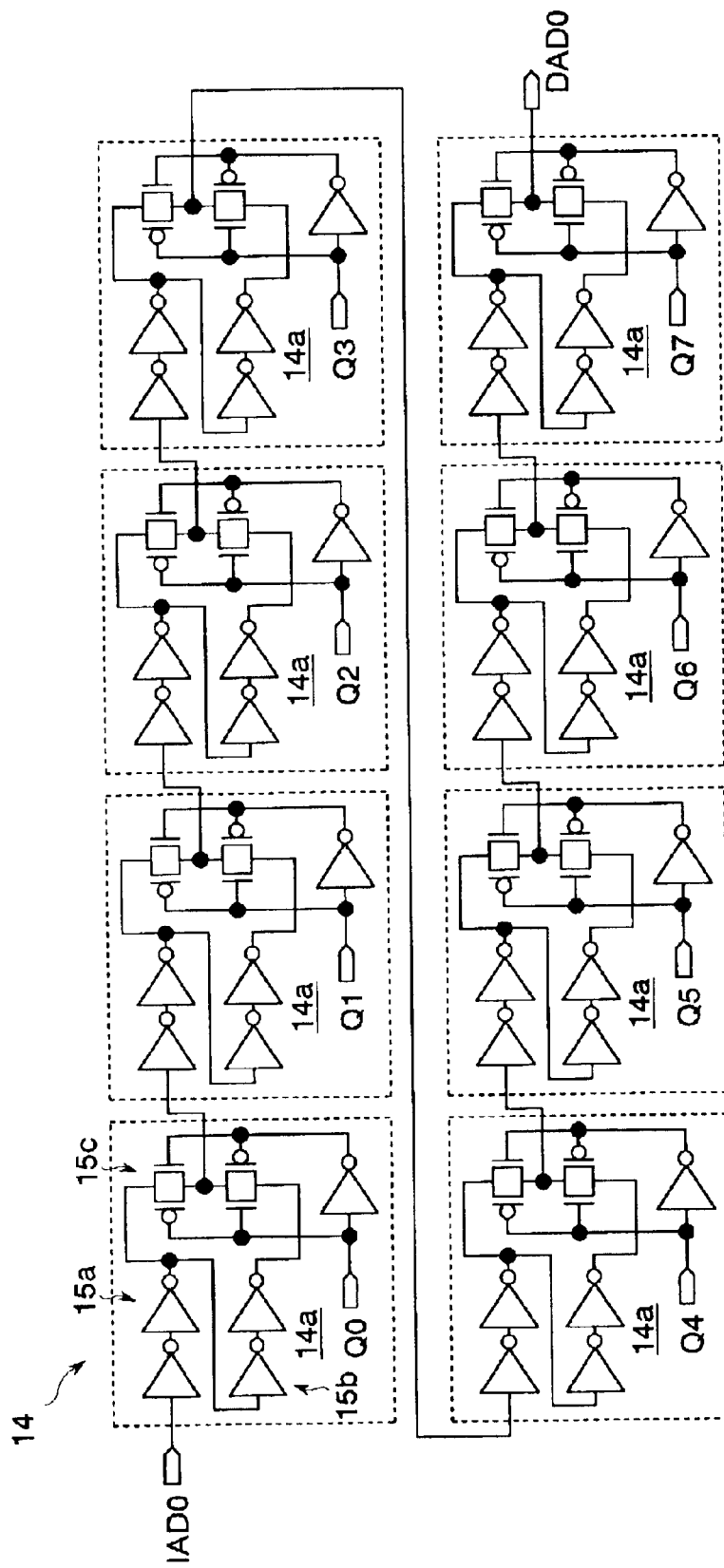
FIG. 2 is a circuit diagram showing the details of a variable delay circuit of FIG. 1.

FIG. 2 shows the details of the variable delay circuit 14 shown in FIG. 1.

The variable delay circuit 14 has eight delay circuits 14a that are connected in cascade and operate in accordance with the delay adjustment signals Q0–Q7, respectively. The delay circuit 14a of the initial stage receives the internal address signal IAD0, while the delay circuit 14a of the final stage outputs the delayed address signal DAD0.

Each delay circuit 14a has first and second delay stages 15a and 15b connected in cascade and has a selector 15c that connects the output of the first delay stage 15a or that of the second delay stage 15b to the next circuit. The first and second delay stages 15a and 15b each are configured by connecting two inverters in series. The selector 15c has a pair of CMOS transmission gates that receive a delay adjustment signal Q (one of the delay adjustment signals Q0–Q7) and the inverted version thereof.

When receiving the delay adjustment signal Q of low level, each delay circuit 14a connects the output of its first delay stage 15a to the next delay circuit 14a. When receiving the delay adjustment signal Q of high level, each delay circuit 14a connects the output of its second delay stage 15b to the next delay circuit 14a. That is, the greater the number of low-level delay adjustment signals Q, the shorter the delay time in the variable delay circuit 14, while the greater the number of high-level delay adjustment signals Q, the longer the delay time in the variable delay circuit 14.

Figure 3:
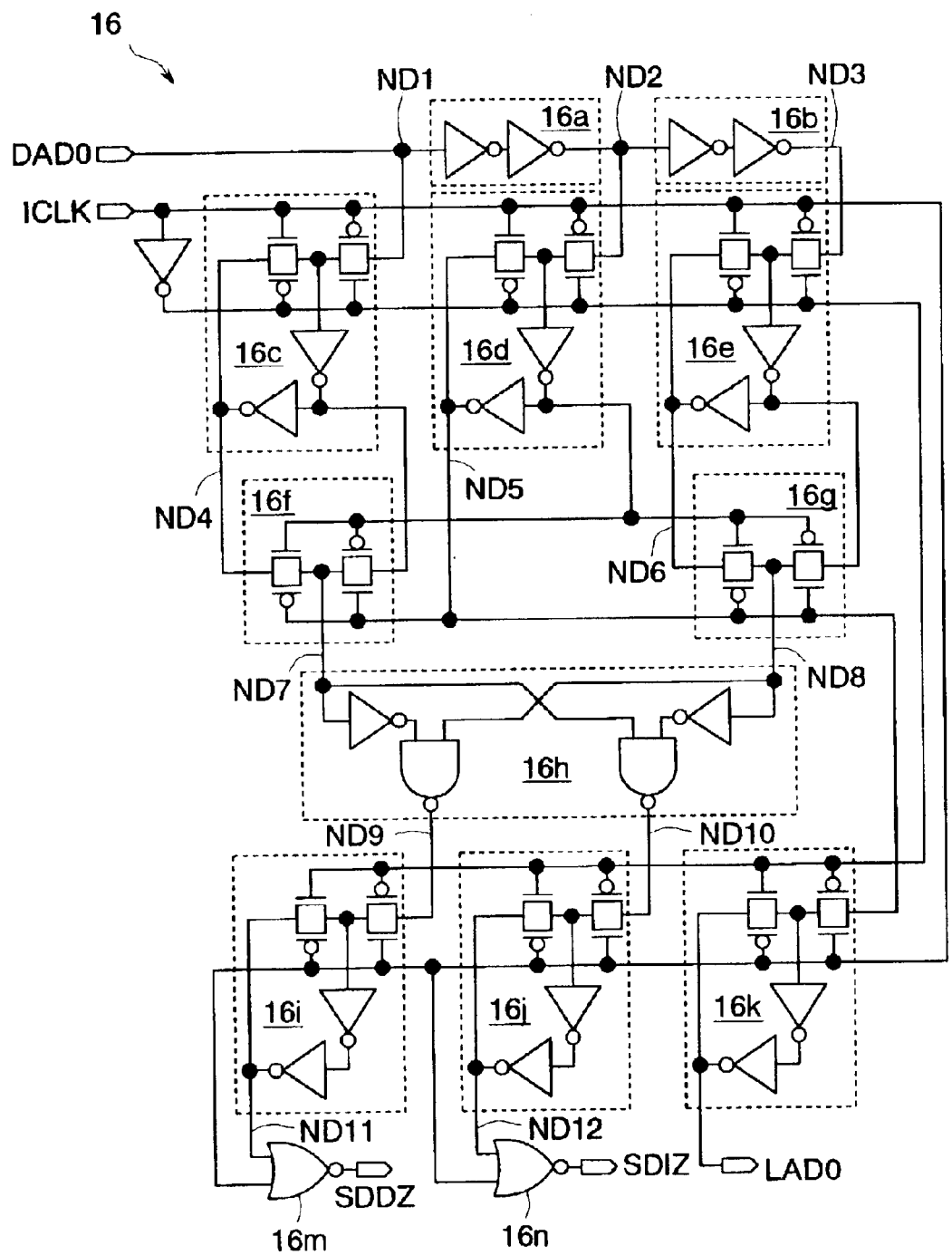
FIG. 3 is a circuit diagram showing the details of a decision circuit of FIG. 1.

FIG. 3 shows the details of the decision circuit 16 shown in FIG. 1.

The decision circuit 16 has delay stages 16a and 16b, latch circuits 16c, 16d, and 16e, exclusive OR circuits 16f and 16g, a comparator 16h, latch circuits 16i, 16j, and 16k, and NOR gates 16m and 16n.

The delay stages 16a and 16b each are configured by connecting two inverters in series, and their delay times are set to the same value. The delay stage 16a delays the delayed address signal DAD0 transmitted to a node ND1 and outputs the delayed signal as a standard delay signal to a node ND2. The delay stage 16b delays the standard delay signal and outputs the delayed signal as a subsequent delay signal to a node ND3. The delayed address signal DAD0 transmitted to the node ND1 is outputted as a previous delay signal to the latch circuit 16c. That is, the delay stages 16a and 16b operate as a delay circuit that generates the standard delay signal obtained by delaying the delayed address signal DAD0 by a predetermined time, the previous delay signal (the delayed address signal DAD0) that is earlier in phase than the standard delay signal, and the subsequent delay signal that is later in phase than the standard delay signal.

The latch circuit 16c has two CMOS transmission gates that are connected in series, and two inverters that are connected in series and make a connection node of the CMOS transmission gates return via the CMOS transmission gate located on the output side. The CMOS transmission gate located on the input side is turned on when the internal clock signal ILK exhibits a low level. The CMOS transmission gate located on the output side is turned on when the internal clock signal ILK exhibits a high level. The latch circuit 16c outputs a latched signal as a complementary signal.

The latch circuit 16c outputs the level of the node ND1 to a node ND4 during the low level of the internal clock signal ILK. The latch circuit 16c latches the level of the node ND1 in synchronization with the rising edge of the internal clock signal ILK and outputs the latched level to the node ND4.

The latch circuits 16d and 16e have the same structure as the latch circuit 16c. The latch circuit 16d latches the level of the node ND2 in synchronization with the rising edge of the internal clock signal ILK and outputs the latched level to the node ND5. The latch circuit 16e latches the level of the node ND3 in synchronization with the rising edge of the internal clock signal ILK and outputs the latched level to the node ND6.

The exclusive OR circuits 16f and 16g each are constituted by two CMOS transmission gates. The exclusive OR circuit 16f outputs a low level to a node ND7 when the nodes ND4 and ND5 exhibit the same logic level, and outputs a high level to the node ND7 when the nodes ND4 and ND5 exhibit different logic levels. The exclusive OR circuit 16g outputs a low level to a node ND8 when the nodes ND6 and ND5 exhibit the same logic level, and outputs a high level to the node ND8 when the nodes ND6 and ND5 exhibit different logic levels.

The latch circuits 16c, 16d, and 16e and exclusive OR circuits 16f and 16g operate together as a level detecting circuit that detects, in synchronization with the internal clock signal ILK, agreement or disagreement in logic level between the standard delay signal at the node ND2 and the previous delay signal (the delayed address signal DAD0) at the node ND1, and agreement or disagreement in logic level between the standard delay signal at the node ND2 and the subsequent delay signal at the node ND3.

The comparator 16h has a NAND gate that receives the inverted level of the node ND7 and the level of the node ND8, and has a NAND gate that receives the inverted level of the node ND8 and the level of the node ND7. The comparator 16h outputs high levels to nodes ND9 and ND10 when the levels of the nodes ND7 and ND8 are the same, and transmits the levels of the nodes ND7 and ND8 to the nodes ND9 and ND10, respectively, when the levels of the nodes ND7 and ND8 are different from each other.

The latch circuits 16i, 16j, and 16k have the same structure as the latch circuit 16c. The latch circuit 16i latches the level of the node ND9 in synchronization with the falling edge of the internal clock signal ILK and outputs the latched level to a node ND11. The latch circuit 16j latches the level of the node ND10 in synchronization with the falling edge of the internal clock signal ILK and outputs the latched level to a node ND12.

The latch circuit 16k (first latch circuit) latches the logic level of the standard delay signal at the node ND5 in synchronization with the falling edge of the internal clock signal ILK and outputs the latched signal as a latched address signal LAD0.

The NOR gate 16m outputs the inverted level of the node ND11 as the decrease signal SDDZ when the internal clock signal ILK is at the low level. The NOR gate 16n outputs the inverted level of the node ND12 as the increase signal SDIZ when the internal clock signal ILK is at the low level.

The comparator 16h, latch circuits 16i, 16j, and 16k, and NOR gates 16m and 16n operate together as a delay-time control circuit that outputs the increase signal SDIZ when a logic level between the standard delay signal at the node ND2 and the previous delay signal at the node ND1 is in disagreement and outputs the decrease signal SDDZ when a logic level between the standard delay signal at the node ND2 and the subsequent delay signal at the node ND3 is in disagreement, as will be described later. The comparator 16h also operates as an inhibiting circuit that inhibits the increase signal SDIZ and decrease signal SDDZ from being outputted when both of the previous and subsequent delay signals disagree in logic level with the standard delay signal.

Figure 4:
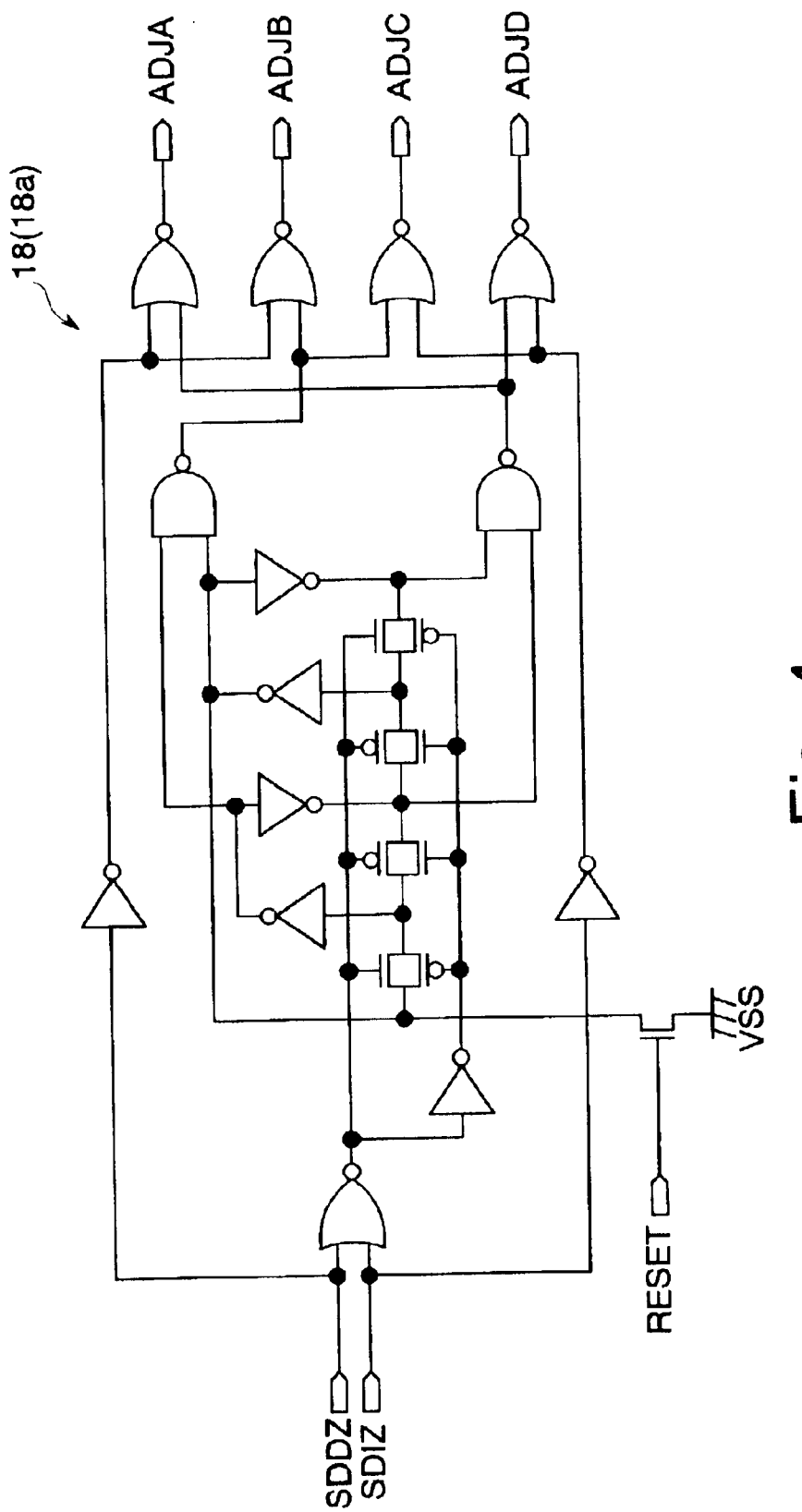
FIG. 4 is a circuit diagram showing the details of a delay adjustment circuit of FIG. 1.
Figure 5:
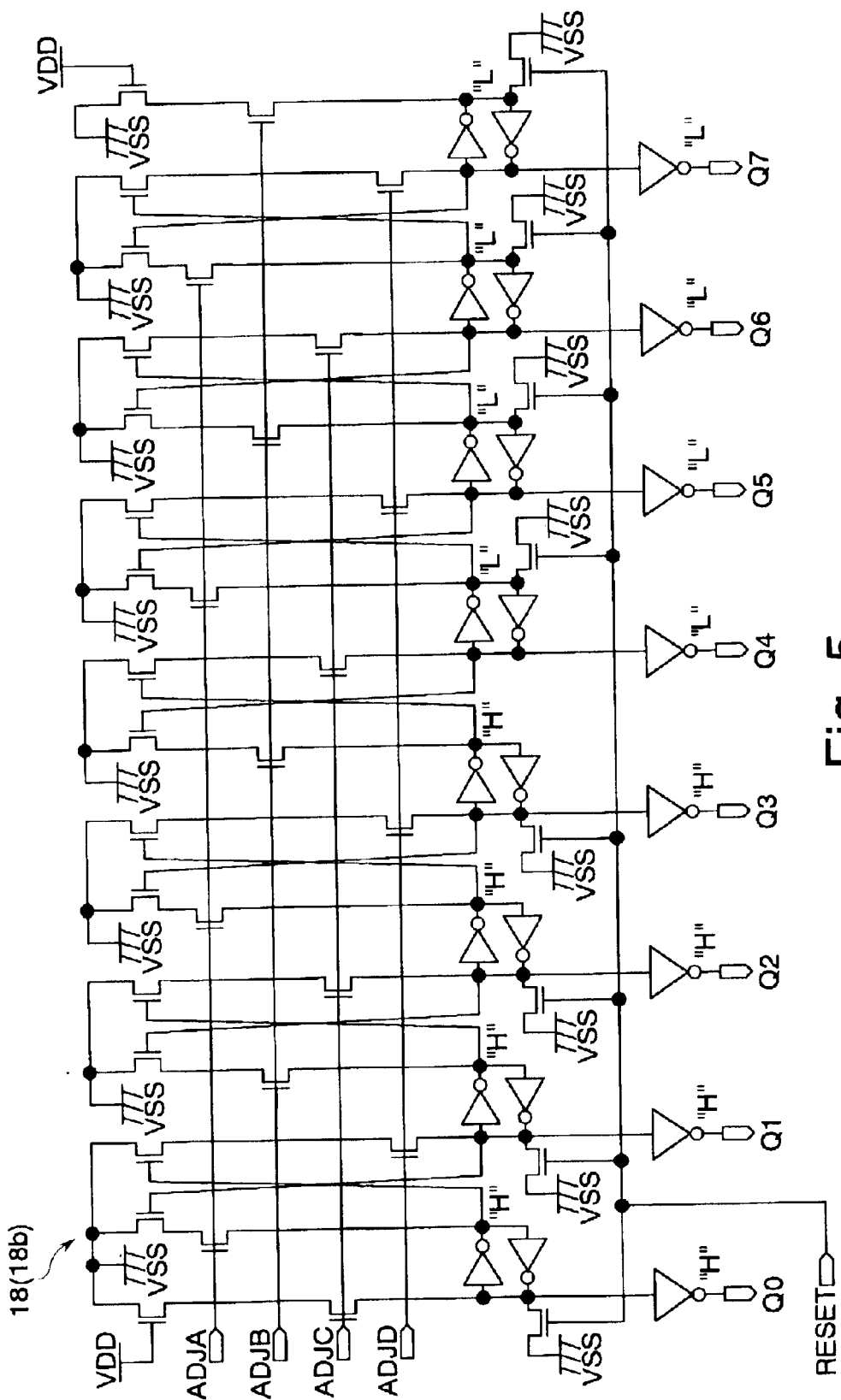
FIG. 5 is a circuit diagram showing the details of the delay adjustment circuit of FIG. 1.

FIGS. 4 and 5 show the details of the delay adjustment circuit 18 shown in FIG. 1. The delay adjustment circuit 18 has a generating unit 18a (FIG. 4) that receives the decrease signal SDDZ or increase signal SDIZ to generate adjustment signals ADJA, ADJB, ADJC, and ADJD. The delay adjustment circuit 18 also has an outputting unit 18b (FIG. 5) that receives the adjustment signals ADJA–ADJD from the generating unit 18a to output the delay adjustment signals Q0–Q7.

The generating unit 18a of FIG. 4 alternately generates the adjustment signals ADJA and ADJB (high level pulses) each time it receives the decrease signal SDDZ (a high level pulse). Also, the generating unit 18a alternately generates the adjustment signals ADJC and ADJD (high level pulses) each time it receives the increase signal SDIZ (a high level pulse). In an initial condition after receiving a reset signal RESET, the generating unit 18a generates the adjustment signal ADJB when receiving the decrease signal SDDZ, and generates the adjustment signal ADJC when receiving the increase signal SDIZ.

In the initial condition after receiving the reset signal RESET, the outputting unit 18b of FIG. 5 outputs the delay adjustment signals Q0–Q3 of high level ("H" in FIG. 5) and the delay adjustment signals Q4–Q7 of low level ("L" in FIG. 5). In this condition, the outputting unit 18b changes the delay adjustment signal Q3 to the low level when receiving the adjustment signal ADJB. Also in this condition, the outputting unit 18b changes the delay adjustment signal Q4 to the high level when receiving the adjustment signal ADJC.

Thereafter, each time the adjustment signal ADJA or ADJB is received, the outputting unit 18b changes a predetermined delay adjustment signal among the delay adjustment signals Q0–Q7 from the high level to the low level. Also, each time the adjustment signal ADJC or ADJD is received, the outputting unit 18b changes a predetermined one of the delay adjustment signals Q0–Q7 from the low level to the high level.

Next, the operations of the foregoing receiver circuits 12 will now be described. Here, for simplifying descriptions, only the operation of receiving the address signal AD0 will be described. The operations of receiving the other address signals AD1–ADn and data signals DQ0–DQn are also performed in the same manner. However, these receiving operations of the receiver circuits 12 are performed independently of each other.

Figure 6:
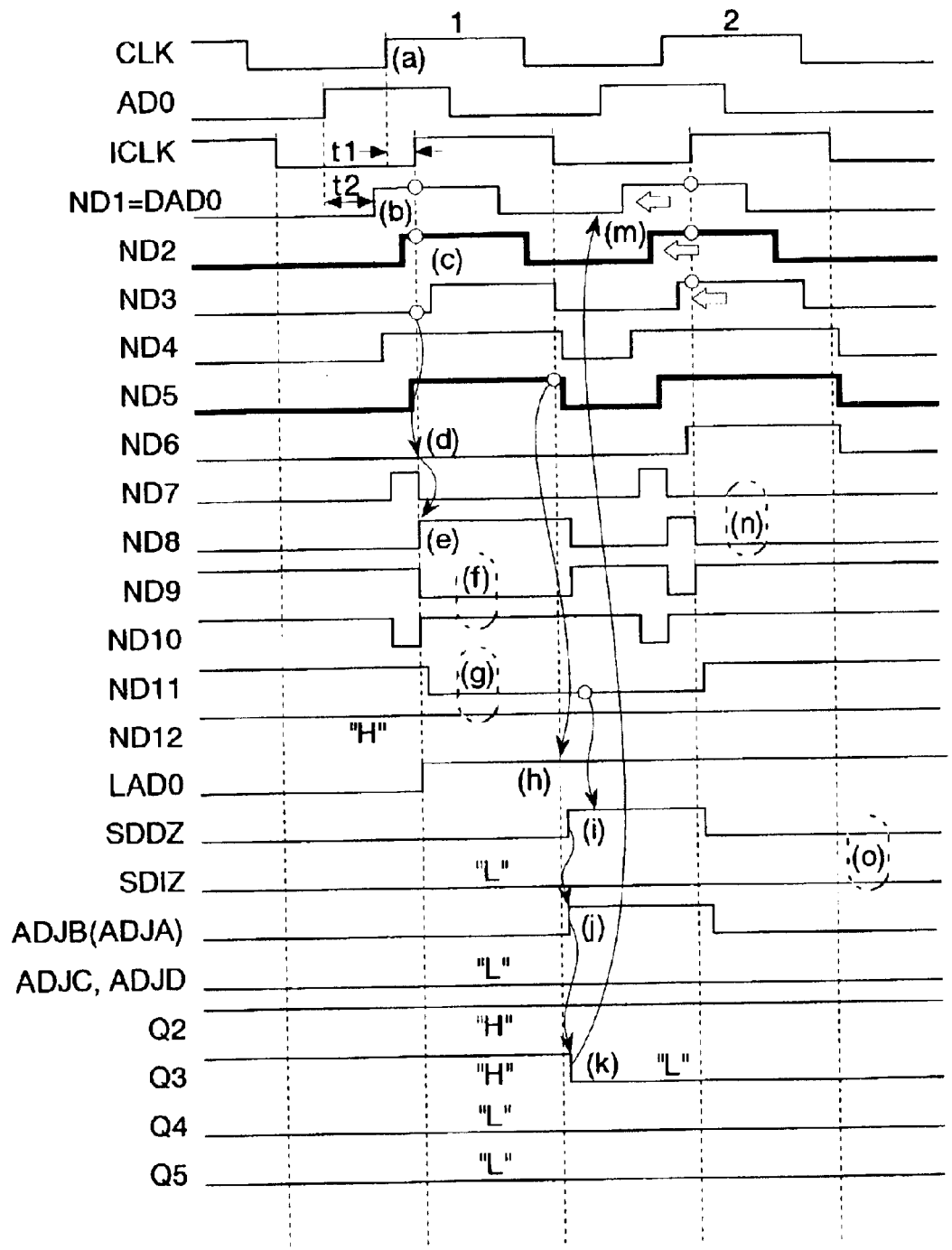
FIG. 6 is a timing diagram showing an operation of a receiver circuit of the first embodiment.

FIG. 6 shows the operation in a case where the delay of the address signal AD0 is longer than that of the clock signal CLK within the DRAM. That is, in this example, due to the influence caused by a rise in temperature or a fluctuation in the power supply voltage, a phase difference t2 between the address signal AD0 and the delayed address signal DAD0 is larger than a phase difference t1 between the clock signal CLK and the internal clock signal ILK.

In the first clock cycle, the address signal AD0 is supplied to the DRAM in synchronization with the rising edge of the clock signal CLK (FIG. 6(a)). The variable delay circuit 14 shown in FIG. 2 outputs, as the previous delay signal, the delayed address signal DAD0 obtained by delaying the address signal AD0 received via the input buffer 10 by a predetermined time, to the node ND1 (FIG. 6(b)). The delay stages 16a and 16b of the decision circuit 16 shown in FIG. 3 output, as the standard and subsequent delay signals, which are obtained by delaying the delayed address signal DAD0 by respective predetermined times, to the nodes ND2 and ND3, respectively (FIG. 6(c)).

At this moment, since the delay amount of the delayed address signal DAD0 relative to the internal clock signal ILK is large, the latch circuit 16e latches an incorrect address signal AD0 (low level), whereas the latch circuits 16c and 16d can latch the correct address signal AD0. That is, the node ND6 is held at the low level (FIG. 6(d)).

The exclusive OR circuit 16f detects the agreement in level between the nodes ND4 and ND5 and outputs the low level to the node ND7. The exclusive OR circuit 16g detects the disagreement in level between the nodes ND5 and ND6 and outputs the high level to the node ND8 (FIG. 6(e)).

The comparator 16h receives the low level of the node ND7 and the high level of the node ND8 and outputs the low level to the node ND9 and the high level to the node ND10 (FIG. 6(f)).

The latch circuit 16i latches the low level of the node ND9 in synchronization with the falling edge of the internal clock signal ILK, and outputs the latched level to the node ND11. The latch circuit 16j latches the high level of the node ND10 in synchronization with the falling edge of the internal clock signal ILK, and outputs the latched level to the node ND12 (FIG. 6(g)).

The latch circuit 16k outputs the high level of the node ND5 as the latched address signal LAD0 during the high level of the internal clock signal ILK. The latch circuit 16k latches the high level of the node ND5 in synchronization with the falling edge of the internal clock signal ILK (FIG. 6(h)).

The latched address signal LAD0 is generated from the standard delay signal that is in the middle of the previous, standard, and subsequent delay signals sequentially transmitted to the nodes ND1, ND2, and ND3, respectively.

Therefore, the address signal AD0 can be latched without fail even in the case where the phase of the address signal AD0 is later than that of the clock signal CLK.

The NOR gate 16m inverts the low level of the node ND11 to output the high level of the decrease signal SDDZ during the low level of the internal clock signal ILK (FIG. 6(i)).

The generating unit 18a of the delay adjustment circuit 18 shown in FIG. 4 outputs the adjustment signal ADJB in response to the high level of the decrease signal SDDZ (FIG. 6(j)). The output unit 18b of the delay adjustment circuit 18 shown in FIG. 5 changes the delay adjustment signal Q3 from the high level to the low level in response to the adjustment signal ADJB (FIG. 6(k)).

Due to the change of the delay adjustment signal Q3 to the low level, the delay time in the variable delay circuit 14 shown in FIG. 2 becomes shorter by the delay time of the second delay stage 15b. That is, the delayed address signal DAD0 is outputted earlier by the delay time of the second delay stage 15b (FIG. 6(m)).

Accordingly, in the second clock cycle, the delayed address signal DAD0 transmitted to the node ND3 is correctly latched by the latch circuit 16e. That is, the discrepancy between the clock signal CLK and the address signal AD0, which occurred within the DRAM is corrected.

FIG. 6 was used to explain the example where the phases of the clock signal CLK and the address signal AD0 became different from each other within the DRAM. However, also in a case where the phases of the clock signal CLK and the address signal AD0 have already been different from each other when they are supplied to the DRAM, the decision circuit 16 operates in the same manner as described above. Accordingly, the discrepancy between the clock signal CLK and the address signal AD0 can be corrected.

In the second clock cycle, the latch circuits 16c, 16d, and 16e latch the correct address signal AD0. Accordingly, all the nodes ND1, ND2, and ND3 (the previous, standard, and subsequent delay signals) change to high levels. Because of both the agreement in level between the nodes ND1 and ND2 and between the nodes ND2 and ND3, the nodes ND7 and ND8 are held at the low levels (FIG. 6(n)).

Consequently, neither the increase signal SDIZ nor decrease signal SDDZ changes to the high level (FIG. 6(o)), resulting in no change in the delay time in the variable delay circuit 14.

Figure 7:
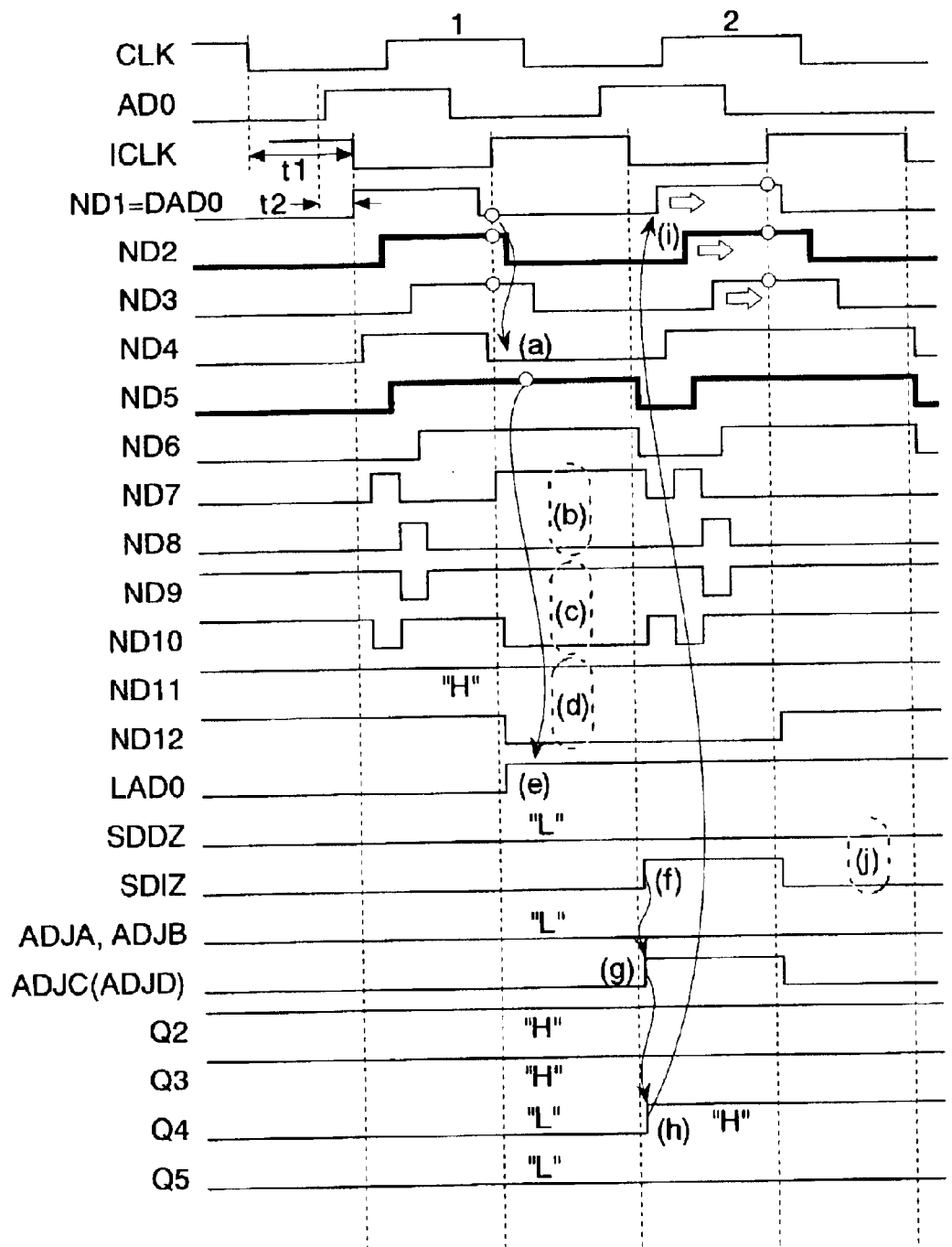
FIG. 7 is a timing diagram showing another operation of the receiver circuit of the first embodiment.

FIG. 7 shows the operation in a case where the delay amount of the address signal AD0 is smaller than that of the clock signal CLK within the DRAM. That is, in this example, due to the influence caused by a rise in temperature or the like, the phase difference t2 between the address signal AD0 and the delayed address signal DAD0 is smaller than the phase difference t1 between the clock signal CLK and the internal clock signal ILK. Detailed descriptions are omitted with respect to the operations same as shown in FIG. 6.

In this example, the delay amount of the internal clock signal ILK relative to the delayed address signal DAD0 is large. Accordingly, the latch circuit 16c latches and outputs the incorrect address signal AD0 (low level) to the node ND4 (FIG. 7(a)).

The exclusive OR circuit 16f detects the disagreement in level between the nodes ND4 and ND5 and outputs the high level to the node ND7, while the exclusive OR circuit 16g detects the agreement in level between the nodes ND5 and ND6 and outputs the low level to the node ND8 (FIG. 7(b)).

The comparator 16h receives the high level of the node ND7 and the low level of the node ND8 and outputs the high level to the node ND9 and the low level to the node ND10 (FIG. 7(c)).

The latch circuit 16i latches the high level of the node ND9 in synchronization with the falling edge of the internal clock signal ILK and outputs the latched level to the node ND11, while the latch circuit 16j latches the low level of the node ND10 in synchronization with the falling edge of the internal clock signal ILK and outputs the latched level to the node ND12 (FIG. 7(d)).

The latch circuit 16k outputs the high level of the node NDS as the latched address signal LAD0 during the high level of the internal clock signal ILK. The latch circuit 16k latches the high level of the node ND5 in synchronization with the falling edge of the internal clock signal ILK (FIG. 7(e)).

The latched address signal LAD0 is generated from the standard delay signal that is in the middle of the previous, standard, and subsequent delay signals sequentially transmitted to the nodes ND1, ND2, and ND3, respectively. Therefore, the address signal AD0 can be latched without fail even in the case where the phase of the address signal AD0 is earlier than that of the clock signal CLK.

The NOR gate 16n inverts the low level of the node ND12 to output the increase signal SDIZ of high level during the low level of the internal clock signal ILK (FIG. 7(f)).

The generating unit 18a of the delay adjustment circuit 18 shown in FIG. 4 outputs the adjustment signal ADJC in response to the increase signal SDIZ of high level (FIG. 7(g)). The output unit 18b of the delay adjustment circuit 18 shown in FIG. 5 changes the delay adjustment signal Q4 from the low level to the high level in response to the adjustment signal ADJC (FIG. 7(h)).

Due to the change of the delay adjustment signal Q4 to the high level, the delay time in the variable delay circuit 14 shown in FIG. 2 becomes longer by the delay time of the second delay stage 15b. That is, the delayed address signal DAD0 is outputted later by the delay time of the second delay stage 15b (FIG. 7(i)).

Accordingly, in the second clock cycle, the delayed address signal DAD0 transmitted to the node ND1 is correctly latched by the latch circuit 16c. That is, the discrepancy between the clock signal CLK and the address signal AD0, which occurred within the DRAM is corrected.

Also with FIG. 7, in a case where the phases of the clock signal CLK and the address signal AD0 have already been different from each other when they are supplied to the DRAM, the decision circuit 16 operates in the same manner as described above. Accordingly, the discrepancy between the clock signal CLK and the address signal AD0 can be corrected.

In the second clock cycle, the latch circuits 16c, 16d, and 16e latch the correct address signal AD0. Accordingly, as with FIG. 6, neither the increase signal SDIZ nor decrease signal SDDZ changes to the high level (FIG. 7(j)), resulting in no change in the delay time in the variable delay circuit 14.

Figure 8:
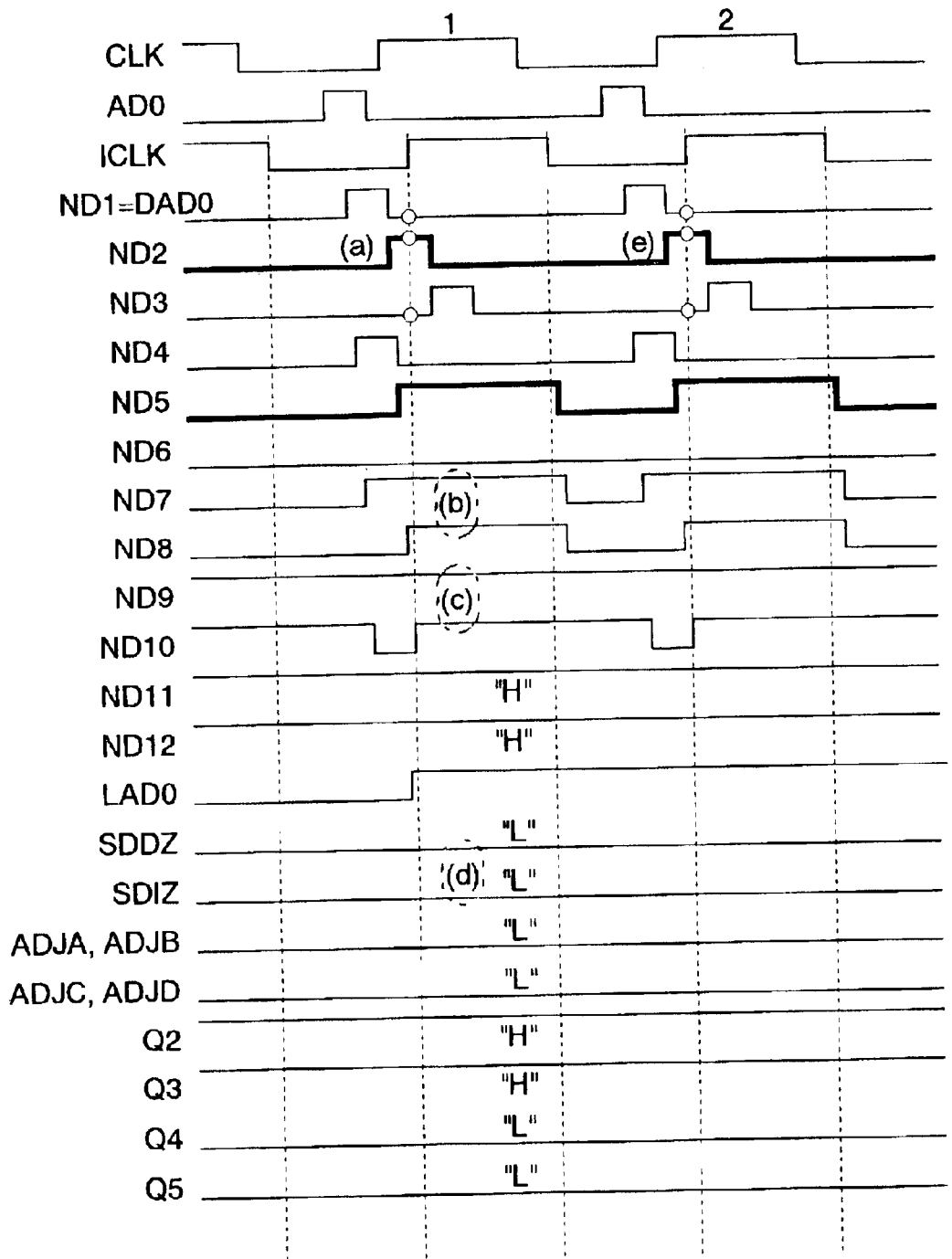
FIG. 8 is a timing diagram showing still another operation of the receiver circuit of the first embodiment.

FIG. 8 shows the operation in a case where the specifications of the setup and hold times of the address signal AD0 relative to the clock signal CLK are short. Since the valid period of the address signal AD0 is short, the valid periods of the address signal AD0 (high levels) at the nodes ND1, ND2, and ND3 do not overlap with each other (FIG. 8(a)).

The exclusive OR circuit 16f outputs the high level to the node ND7 in response to the disagreement in level between the nodes ND4 and ND5. The exclusive OR circuit 16g outputs the high level to the node ND8 in response to the disagreement in level between the nodes ND5 and ND6 (FIG. 8(b)).

The comparator 16h of the decision circuit 16 receives the high levels of the nodes ND7 and ND8 and outputs the high levels to the nodes ND9 and ND10 (FIG. 8(c)). That is, when the exclusive OR circuits 16f and 16g both detect the disagreement of the address signal AD0, the comparator 16h masks this disagreement information, and operates in the same manner as in the case where all the levels of the nodes ND1, ND2, and ND3 latched by the internal clock signal ILK are in agreement.

Accordingly, the high levels are outputted at the nodes ND11 and ND12, and neither the decrease signal SDDZ nor increase signal SDIZ is outputted (FIG. 8(d)). Consequently, the delay time in the variable delay circuit 14 is not changed, and in the second clock cycle, the difference in phase between the internal clock signal ILK and the delayed address signal DAD0 remains unchanged (FIG. 8(e)).

In the first embodiment described above, the decision circuits 16 of the respective receiver circuits 12 were used to detect the deviation of the input signals, such as the address signals AD0–ADn, data signals DQ0–DQn and so on, relative to the clock signal CLK, and the phases of these input signals were adjusted. For this reason, even when a change in temperature, a fluctuation in voltage or the like causes a discrepancy in timing between the input signals and the clock signal CLK, the receiver circuits 12 can receive the input signals without fail, in synchronization with the clock signal CLK.

Since the timings of receiving the input signals can be automatically adjusted within the respective receiver circuits 12, the valid periods (the setup and hold times) of the input signals relative to the clock signal CLK can be minimized. As a result, the upper limit of the frequency of the clock signal CLK can be prevented from being restricted by the valid period, and the transmission rate of the input signals can be increased.

The input signals do not change in level as frequently as the clock signal CLK. For this reason, the frequency of internal operations of the variable delay circuits 14 receiving the input signals is lower than the frequency of operations of other variable delay circuits receiving the clock signal CLK. As a result, the power consumption in the variable delay circuits 14 can be reduced.

The decision circuits 16 each were so configured as to include the delay stages 16a and 16b for sequentially delaying the address signal AD0 (the input signal); the latch circuits 16c, 16d, and 16e for latching the delayed address signal AD0 (the previous, standard, and subsequent delay signals) in synchronization with the clock signal CLK; and the exclusive OR circuits 16f and 16g for comparing the output levels of the latch circuits 16c, 16d, and 16e. Comparing the three delay signals (the previous, standard, and subsequent delay signals) having different timings in synchronization with the clock signal CLK allows the deviation in timing of the input signal to be easily detected and allows the correct timing to be resumed.

Also, the decision circuits 16 each were so configured as to include the comparator 16h (inhibiting circuit) for inhibiting the increase signal SDIZ and decrease signal SDDZ from being outputted when both of the previous and subsequent delay signals disagree in logic level with the standard delay signal. As a result, even in the case where the valid period (timing specification) of the address signal AD0 (the input signal) relative to the clock signal CLK is short as shown in FIG. 8, the timing of the input signal can be prevented from erroneously being adjusted.

Figure 9:
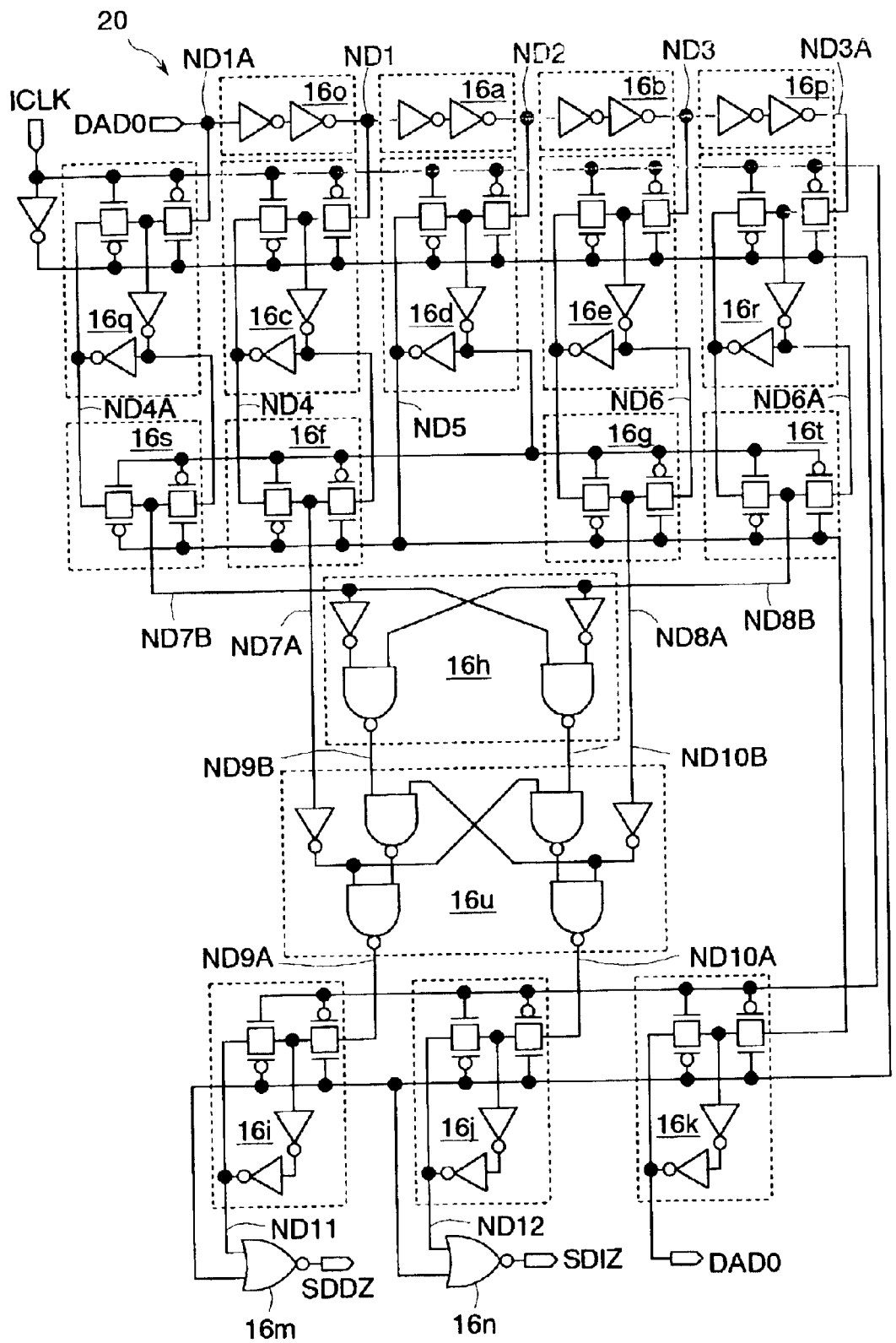
FIG. 9 is a circuit diagram showing the essential portions of a second embodiment of the present invention.

FIG. 9 shows the essential portions of a second embodiment of semiconductor integrated circuit according to the present invention. In the second embodiment, the same elements corresponding to those described in the first embodiment are identified by the same reference designations, and their detailed descriptions are omitted.

In this embodiment, decision circuits 20 are formed in place of the decision circuits 16 of the first embodiment. The other structures are the same as those in the first embodiment (FIG. 1). That is, the DRAM has the input buffers 10 and the receiver circuits each having the variable delay circuit 14, delay adjustment circuit 18, and decision circuit 20. FIG. 9 shows the decision circuit 20 of the receiver circuit that receives the address signal AD0, but the decision circuits 20 of the receiver circuits that receive the other address signals AD1–ADn and the data signals DQ0–DQn have the same structure as the decision circuit 20 shown in FIG. 9.

Each decision circuit 20 is formed by adding delay stages 16o and 16p, latch circuits 16q and 16r, exclusive OR circuits 16s and 16t, and a comparator 16u to each decision circuit 16 of the first embodiment.

The delay stages 16o, 16a, 16b, and 16p are connected in cascade via the nodes ND1, ND2, and ND3. The delay times of the delay stages 16o, 16a, 16b, and 16p are set to the same value. The delayed address signal DAD0 transmitted to an input node ND1A of the delay stage 16o is outputted, as a previous delay signal, to the latch circuit 16q. The delay stages 16o, 16a, 16b, and 16p constitute a delay circuit that generates a standard delay signal (node ND2) by delaying the delayed address signal DAD0 by a predetermined time, a plurality of previous delay signals (nodes ND1A and ND1) that are earlier in phase than the standard delay signal, and a plurality of subsequent delay signals (nodes ND3 and ND3A) that are later in phase than the standard delay signal.

The latch circuits 16q and 16r have the same structure as the latch circuit 16c. The latch circuit 16q latches the level of the node ND1A in synchronization with the rising edge of the internal clock signal ILK and outputs the latched level to a node ND4A. The latch circuit 16r latches the level of the node ND3A in synchronization with the rising edge of the internal clock signal ILK and outputs the latched level to a node ND6A.

The exclusive OR circuits 16s and 16t have the same structure as the exclusive OR circuit 16f. The exclusive OR circuit 16s outputs a low level to a node ND7B when the nodes ND4A and ND5 exhibit the same logic levels, whereas the exclusive OR circuit 16s outputs a high level to the node ND7B when the nodes ND4A and ND5 exhibit different logic levels. The exclusive OR circuit 16t outputs a low level to a node ND8B when the nodes ND6A and NDS exhibit the same logic level; whereas the exclusive OR circuit 16t outputs a high level to the node ND8B when the nodes ND6A and ND5 exhibit different logic levels. The exclusive OR circuits 16f and 16g output their operation results to nodes ND7A and ND8A, respectively.

The latch circuits 16q, 16c, 16d, 16e, and 16r and exclusive OR circuits 16s, 16f, 16g, and 16t operate together as a level detecting circuit that detects, in synchronization with the internal clock signal ILK, an agreement or disagreement in logic level between the standard delay signal at the node ND2 and each of the previous delay signals at the nodes ND1A and ND1, and an agreement or disagreement in logic level between the standard delay signal at the node ND2 and each of the subsequent delay signals at the nodes ND3 and ND3A.

The comparator 16*h* outputs high levels to nodes ND9B and ND10B when the levels of the nodes ND7B and ND8B are the same; whereas the comparator 16*h* transmits the levels of the nodes ND7B and ND8B to the nodes ND9B and ND10B, respectively, when the levels of the nodes ND7B and ND8B are different from each other.

The comparator 16*u* outputs high levels to nodes ND9A and ND10A when the levels of nodes ND7A and ND8A are high; whereas the comparator 16*u* transmits the levels of the nodes ND7A and ND8A to the nodes ND9A and ND10A, respectively, when the levels of the nodes ND7A and ND8A are different from each other. When the levels of nodes ND7A and ND8A are low, the comparator 16*u* outputs the levels of the output nodes ND9B and ND10B of the comparator 16*h* to the nodes ND9A and ND10A, respectively.

The comparators 16*h* and 16*u*, latch circuits 16*i*, 16*j*, and 16*k*, and NOR gates 16*m* and 16*n* operate together as a delay-time control circuit that outputs the increase signal SDIZ when a logic level between the standard delay signal at the node ND2 and the previous delay signal at the node ND1A is in disagreement or when a logic level between the standard delay signal at the node ND2 and the previous delay signal at the node ND1 is in disagreement, and that outputs the decrease signal SDDZ when a logic level between the standard delay signal at the node ND2 and the subsequent delay signal at the node ND3 is in disagreement or when a logic level between the standard delay signal at the node ND2 and the subsequent delay signal at the node ND3A is in disagreement. The comparators 16*h* and 16*u* also operate together as an inhibiting circuit that inhibits the increase and decrease signals SDIZ and SDDZ from being outputted when both of the previous and subsequent delay signals disagree in logic level with the standard delay signal.

Next, the operations of the receiver circuits of the second embodiment will be described. Here, for purposes of simple descriptions, only the operation of receiving the address signal AD0 will be described. The operations of receiving the other address signals AD1–ADn and data signals DQ0–DQn are performed in the same manner.

Figure 10:
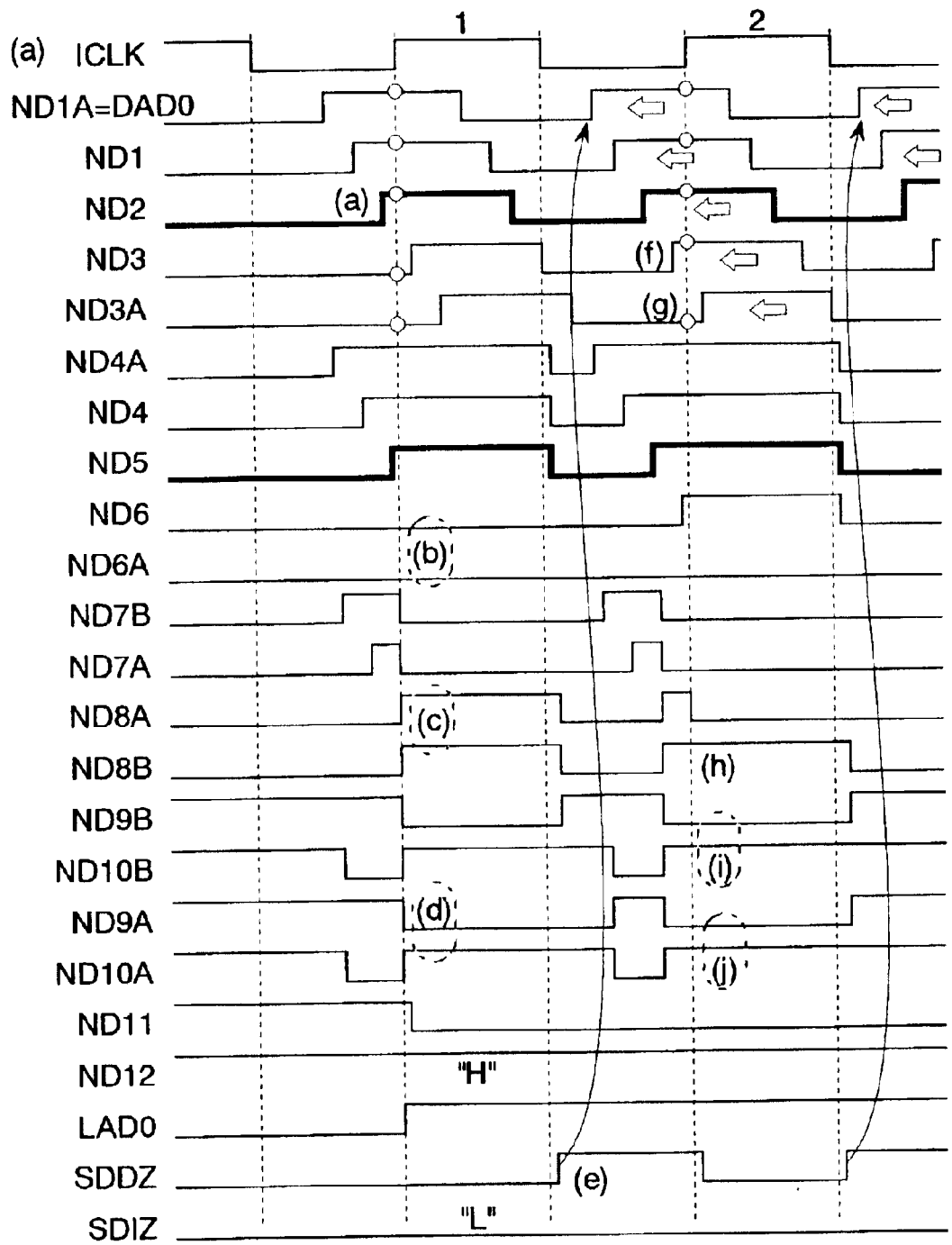
FIG. 10 is a timing diagram showing an operation of a receiver circuit of the second embodiment.

FIG. 10 shows the operation in a case where the delay of the address signal AD0 is longer than that of the clock signal CLK within the DRAM. Detailed descriptions are omitted with respect to the same operations as with the first embodiment.

The delay stages 16*o*, 16*a*, 16*b*, and 16*p* shown in FIG. 9 output the signals obtained by sequentially delaying the delayed address signal DAD0 to the nodes ND1, ND2, ND3, and ND3A, respectively. The delayed address signal DAD0 is outputted to the node ND1A as the previous delay signal (FIG. 10(*a*)).

The latch circuits 16*q*, 16*c*, 16*d*, 16*e*, and 16*r* latch the levels of the nodes ND1A, ND1, ND2, ND3, and ND3A, respectively, in synchronization with the rising edge of the internal clock signal ILK. At this moment, since the delay amount of the delayed address signal DAD0 relative to the internal clock signal ILK is large, the latch circuits 16*e* and 16*r* latch the incorrect address signal AD0 (low level) (FIG. 10(*b*)).

The exclusive OR circuits 16*g* and 16*t* detect the disagreement between the levels of the nodes ND5 and ND6 and the disagreement between the levels of the nodes ND5 and ND6A, respectively, and output high levels to the nodes ND8A and ND8B, respectively (FIG. 10(*c*)).

The comparator 16*u* receives the low level of the node ND7A and the high level of the node ND8A and outputs the low level to the node ND9A and the high level to the node ND10A (FIG. 10(*d*)). Accordingly, the decrease signal SDDZ of high level is outputted during the low level of the internal clock signal ILK (FIG. 10(*e*)).

The output of the decrease signal SDDZ shortens the delay time in the variable delay circuit 14 (FIG. 1), and thus the phase of the delayed address signal DAD0 relative to the clock signal is advanced. This ensures that, in the second clock cycle, the delayed address signal DAD0 transmitted to the node ND3 is correctly latched by the latch circuit 16*e* (FIG. 10(*f*)).

At this moment, however, the latch circuit 16*r* cannot correctly latch the delayed address signal DAD0 transmitted to the node ND3A (FIG. 10(*g*)). Accordingly, the exclusive OR circuit 16*t* detects the disagreement in level between the nodes ND5 and ND6A, and outputs the high level to the node ND8B (FIG. 10(*h*)).

The comparator 16*h* receives the low level of the node ND7B and the high level of the node ND8B and outputs the low level to the node ND9B and the high level to the node ND10B (FIG. 10(*i*)).

The comparator 16*u* receives the low levels of the nodes ND7A and ND8A and transmits the low level of the node ND9B to the node ND9A and the high level of the node ND10B to the node ND10A (FIG. 10(*j*)).

Accordingly, during the low level of the internal clock signal ILK, the decrease signal SDDZ of high level is outputted again (FIG. 10(*k*)). This output of the decrease signal SDDZ further shortens the delay time in the variable delay circuit 14 (FIG. 1), and thus the phase of the delayed address signal DAD0 relative to the clock signal is further advanced. This ensures that, in the third clock cycle (not shown), the delayed address signal DAD0 transmitted to the node ND3A is correctly latched by the latch circuit 16*r*. That is, the discrepancy between the clock signal CLK and the address signal AD0, which occurred within the DRAM is corrected.

Figure 11:
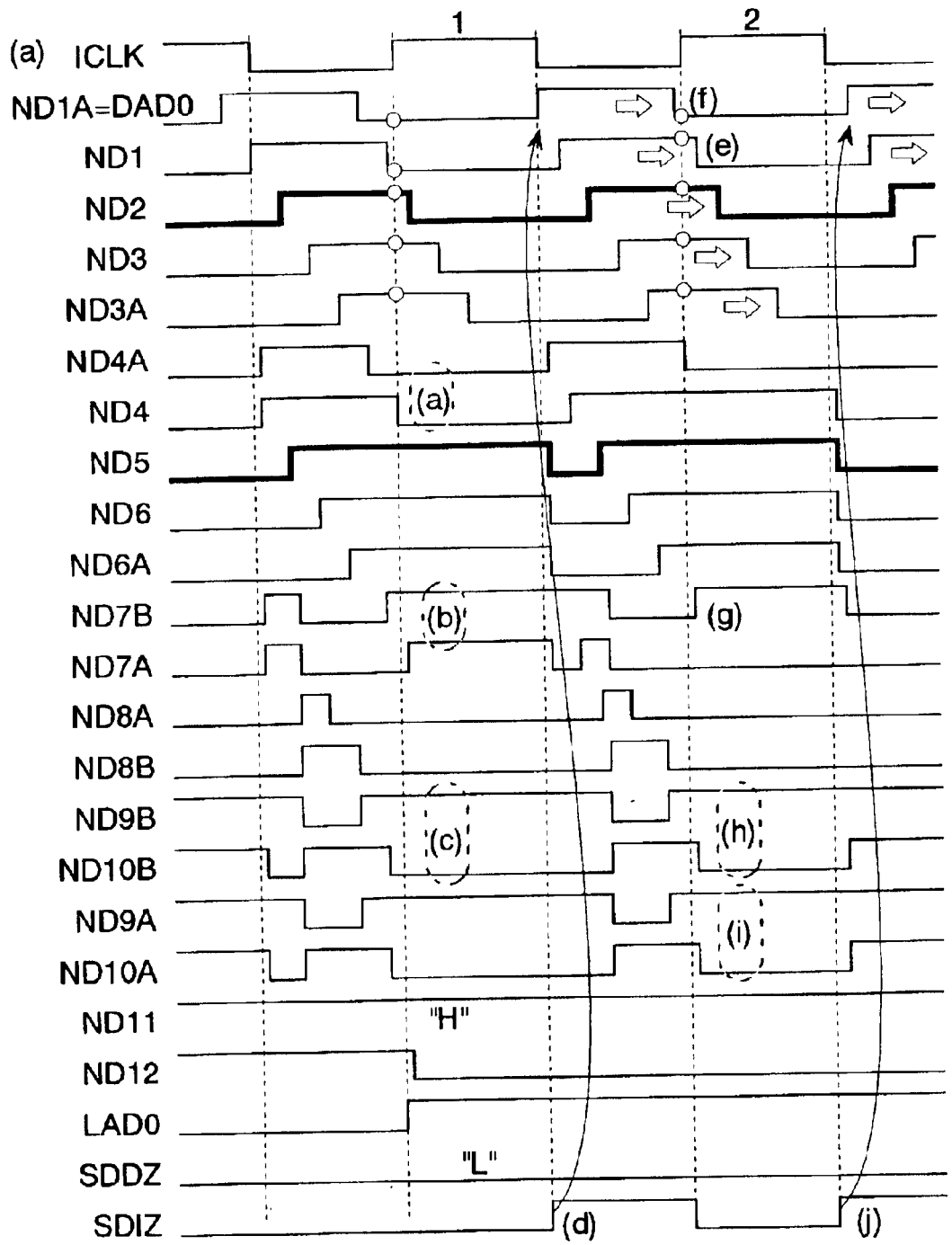
FIG. 11 is a timing diagram showing another operation of the receiver circuit of the second embodiment.

FIG. 11 shows the operation in a case where the delay amount of the address signal AD0 is smaller than that of the clock signal CLK within the DRAM. Detailed descriptions are omitted with respect to the same operations as with the first embodiment and FIG. 10.

The latch circuits 16*q*, 16*c*, 16*d*, 16*e*, and 16*r* shown in FIG. 9 latch the levels of the nodes ND1A, ND1, ND2, ND3, and ND3A, respectively, in synchronization with the rising edge of the internal clock signal ILK. At this moment, since the delay amount of the delayed address signal DAD0 relative to the internal clock signal ILK is small, the latch circuits 16*q* and 16*c* latch the incorrect address signal AD0 (low level) (FIG. 11(*a*)).

The exclusive OR circuits 16*s* and 16*f* detect the disagreement between the level of the node NDS and that of the node ND4A and the disagreement between the level of the node ND5 and that of the node ND4, respectively, and output high levels to the nodes ND7B and ND7A, respectively (FIG. 11(*b*)).

The comparator 16*u* receives the high level of the node ND7A and the low level of the node ND8A and outputs the high level to the node ND9A and the low level to the node ND10A (FIG. 11(*c*)). Accordingly, the increase signal SDIZ of high level is outputted during the low level of the internal clock signal ILK (FIG. 11(*d*)).

Since this output of the increase signal SDIZ elongates the delay time in the variable delay circuit 14 (FIG. 1), the phase of the delayed address signal DAD0 relative to the clock signal is delayed. This ensures that, in the second clock cycle, the delayed address signal DAD0 transmitted to the node ND1 is correctly latched by the latch circuit 16c (FIG. 11(e)).

At this moment, however, the latch circuit 16q cannot correctly latch the delayed address signal DAD0 transmitted to the node ND1A (FIG. 11(f)). Accordingly, the exclusive OR circuit 16s detects the disagreement in level between the nodes ND5 and ND4A, and outputs the high level to the node ND7B (FIG. 11(g)).

The comparator 16h receives the high level of the node ND7B and the low level of the node ND8B and outputs the high level to the node ND9B and the low level to the node ND 10B (FIG. 11(h)).

The comparator 16u receives the low levels of the nodes ND7A and ND8A and transmits the high level of the node ND9B to the node ND9A and the low level of the node ND10B to the node ND10A (FIG. 11(i)).

Accordingly, during the low level of the internal clock signal ILK, the increase signal SDIZ of high level is outputted again (FIG. 11(i)). This output of the increase signal SDIZ further elongates the delay time in the variable delay circuit 14 (FIG. 1), and thus the phase of the delayed address signal DAD0 relative to the clock signal is further delayed. This ensures that, in the third clock cycle (not shown), the delayed address signal DAD0 transmitted to the node ND1A is correctly latched by the latch circuit 16q. That is, the discrepancy between the clock signal CLK and the address signal AD0, which occurred within the DRAM is corrected.

The second embodiment can obtain the same effects as the foregoing first embodiment. In the second embodiment, there were formed, in the decision circuit 20, the delay stages 16o, 16a, 16b, and 16p for sequentially delaying the address signal AD0 (input signal); the latch circuits 16q, 16c, 16d, 16e, and 16r for latching the respective delayed address signals AD0 (the two previous delay signals, the standard delay signal, and the two subsequent delay signals) in synchronization with the clock signal CLK; and the exclusive OR circuits 16s, 16f, 16g, and 16t for comparing the output levels of the latch circuits 16q, 16c, 16d, 16e, and 16r. The comparison of the five delay signals (the previous, standard, and subsequent delay signals) of different timings in synchronization with the clock signal CLK allows any timing deviation of the input signal to be easily detected even when such timing deviation being small, or widens the range in which the timing deviation of the input signal can be detected.

Figure 12:
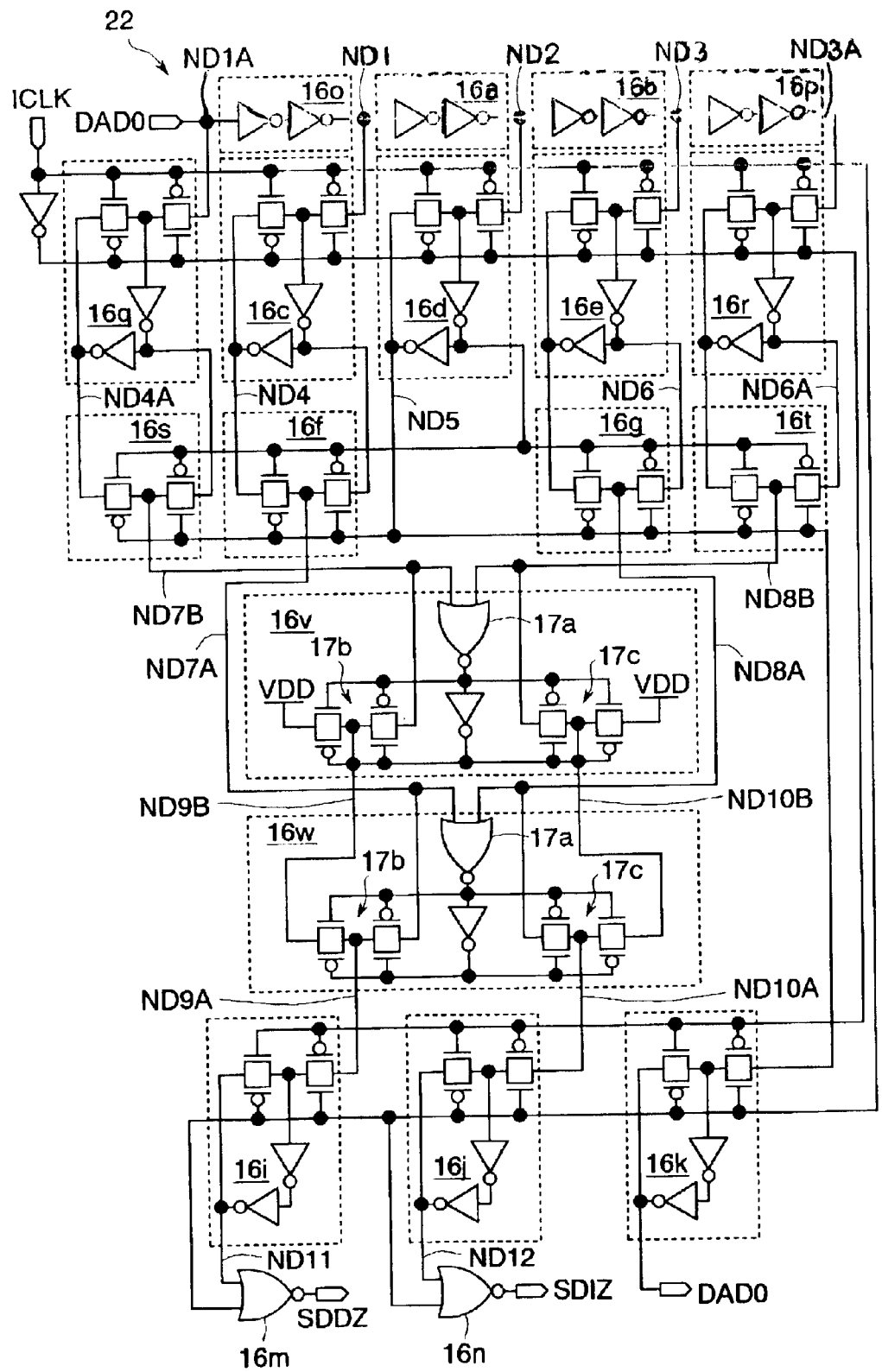
FIG. 12 is a circuit diagram showing the essential portions of a third embodiment of the present invention.

FIG. 12 shows the essential portions of a third embodiment of semiconductor integrated circuit according to the present invention. In the third embodiment, the same elements corresponding to those described in the first and second embodiments are identified by the same reference designations, and their detailed descriptions are omitted.

In this third embodiment, decision circuits 22 are formed in place of the decision circuits 20 of the second embodiment. The other structures are the same as those in the first and second embodiments. That is, the DRAM has the input buffers 10 and the receiver circuits each having the variable delay circuit 14, delay adjustment circuit 18, and decision circuit 22. FIG. 12 shows the decision circuit 22 of the receiver circuit that receives the address signal AD0, but the decision circuits 22 of the receiver circuits that receive the other address signals AD1–ADn and the data signals DQ0–DQn have the same structure as the decision circuit 22 shown in FIG. 12.

Each decision circuit 22 has comparators 16v and 16w in place of the comparators 16h and 16u of each decision circuit 20 of the second embodiment (FIG. 9). The comparators 16v and 16w operate in the same manner as the comparators 16h and 16u. The other structures of each decision circuit 22 are the same as those of each decision circuit 20.

The comparator 16v has a NOR gate 17a that receives the levels of the nodes ND7B and ND8B; a switch circuit 17b controlled by the output of the NOR gate 17a to connect a power supply line VDD (high level) or the node ND7B to a node ND9B; and a switch circuit 17c controlled by the output of the NOR gate 17a to connect a power supply line VDD (high level) or the node ND8B to a node ND10B. The switch circuits 17b and 17c each are configured by connecting two CMOS transmission gates in series.

The comparator 16w has the same structure as the comparator 16v. A switch circuit 17b of the comparator 16w is controlled by the output of a NOR gate 17a thereof to connect the node ND9B or ND7A to the node ND9A. A switch circuit 17c of the comparator 16w is controlled by the output of the NOR gate 17a thereof to connect the node ND10B or ND8A to the node ND10A.

The third embodiment can obtain the same effects as the foregoing first and second embodiments. Additionally, in the third embodiment, the comparators 16v and 16w each were constituted by the switch circuits 17a and 17b each composed of the two CMOS transmission gates, and hence the number of elements that constitute the circuits can be reduced as compared with the comparators 16h and 16u of the second embodiment. As a result, the layout size of the comparators 16v and 16w can be reduced.

Figure 13:
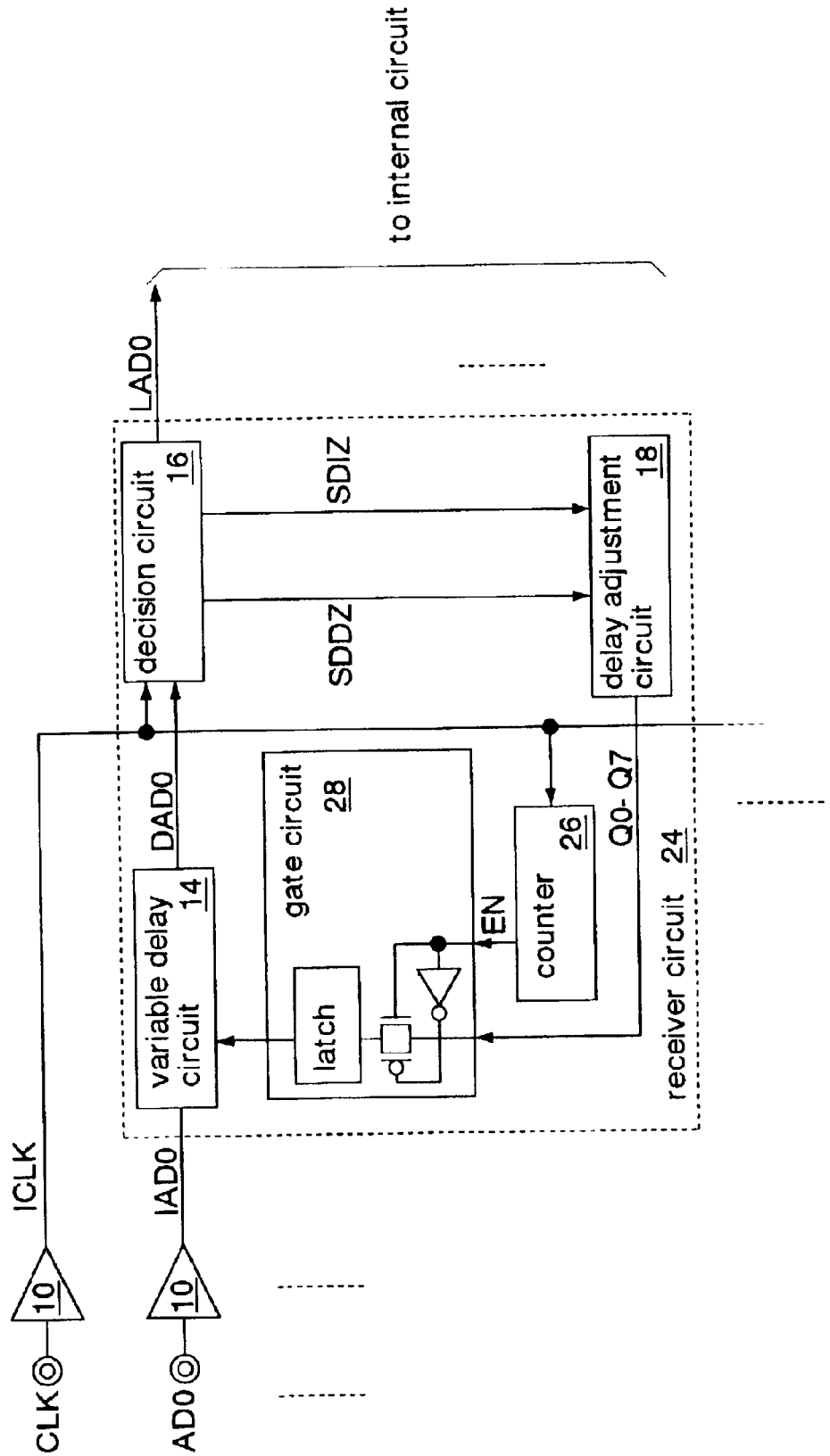
FIG. 13 is a block diagram showing a fourth embodiment of the present invention.

FIG. 13 shows the essential portions of a fourth embodiment of semiconductor integrated circuit according to the present invention. In the fourth embodiment, the same elements corresponding to those described in the first embodiment are identified by the same reference designations, and their detailed descriptions are omitted.

In this fourth embodiment, receiver circuits 24 (first receiver circuit) are formed in place of the receiver circuits 12 of the first embodiment. The other structures are the same as those in the first embodiment. That is, the DRAM has the input buffers 10 and the receiver circuits 24 that receive the address signals AD0–ADn and data signals DQ0–DQn.

Each receiver circuit 24 is configured by adding a counter 26 and a gate circuit 28 to each receiver circuit 12 of the first embodiment. The counter 26 performs its counting operation in synchronization with the rising edge of the internal clock signal ILK, and outputs an enable signal EN that exhibits a high level, for example, for the time period of one clock cycle at every eight clock cycles.

The gate circuit 28 has a latch and a switch composed of a CMOS transmission gate and so on. The switch of the gate circuit 28 is turned on, only during the high level of the enable signal EN, to transmit the delay adjustment signals Q0–Q7 from the delay adjustment circuit 18 to the latch of the gate circuit 28. The delay adjustment signals Q0–Q7 held in the latch of the gate circuit 28 are outputted to the variable delay circuit 14. That is, in the present embodiment, the variable delay circuit 14 adjusts its delay time once every eight clock cycles. That is, the counter 26 and gate circuit 28 operate together as a mask circuit that outputs the delay adjustment signals Q0–Q7 to the variable delay circuit 14 every eight clock cycles.

It should be noted that when the count value of the counter 26 is allowed to be set externally to the DRAM, it can set the interval of the adjustment of the variable delay circuit 14 to a value that is optimum according to the system incorporating the DRAM.

The fourth embodiment can obtain the same effects as the foregoing first embodiment. Additionally, in the fourth embodiment, since the delay time in the variable delay circuit 14 was adjusted every eight clock cycles, the influences of the jitter or the like of the clock signal CLK can be prevented.

Figure 14:
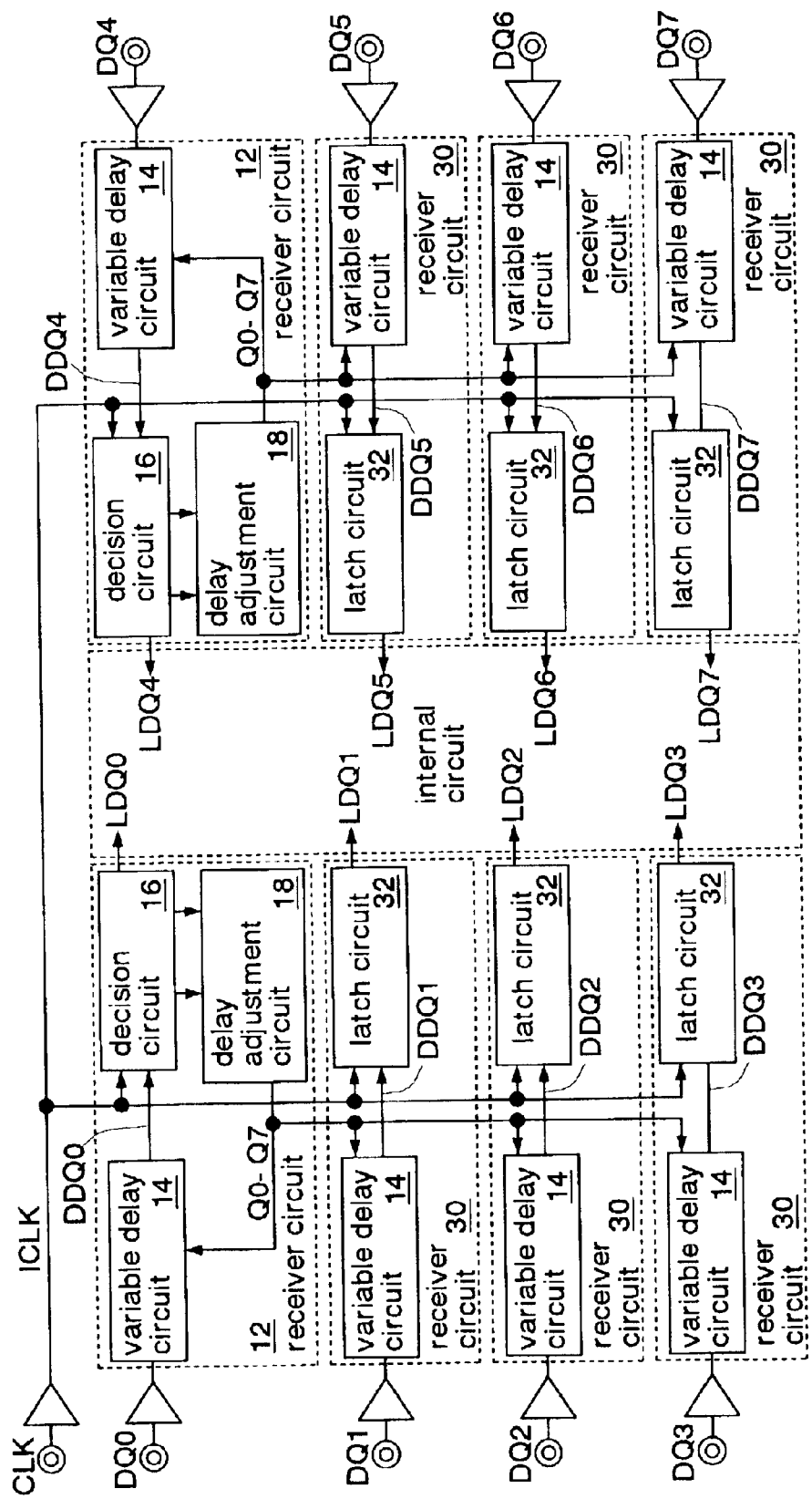
FIG. 14 is a block diagram showing a fifth embodiment of the present invention.

FIG. 14 shows the essential portions of a fifth embodiment of semiconductor integrated circuit according to the present invention. In the fifth embodiment, the same elements corresponding to those described in the first embodiment are identified by the same reference designations, and their detailed descriptions are omitted.

In this fifth embodiment, the DRAM for which the present invention is applied has eight data terminals for receiving the 8-bit data signals DQ0–DQn. The receiver circuits 12 are formed corresponding to the respective data signals DQ0 and DQ4, while receiver circuits 30 (second receiver circuit) are formed corresponding to the respective data signals DQ1–DQ3 and DQ5–DQ7 (second input signal). The receiver circuits 12 are the same as those of the first embodiment.

The receiver circuits 30 each have the variable delay circuit 14 and a latch circuit 32 (second latch circuit). The variable delay circuits 14 of the receiver circuits 30 corresponding to the data signals DQ1–DQ3 receive the delay adjustment signals Q0–Q7 outputted from the delay adjustment circuit 18 of the receiver circuit 12 corresponding to the data signal DQ0. The variable delay circuits 14 of the receiver circuits 30 corresponding to the data signals DQ5–DQ7 receive the delay adjustment signals Q0–Q7 outputted from the delay adjustment circuit 18 of the receiver circuit 12 corresponding to the data signal DQ4.

Each latch circuit 32 latches a delayed data signal (e.g., DDQ1) from a respective variable delay circuit 14 in synchronization with the rising edge of the internal clock signal ILK, and outputs the latched signal as a latched data signal (e.g., LDQ1). Each latch circuit 32 outputs, as the latched data signal, the delayed data signal outputted from the respective variable delay circuit 14 until the next rising edge of the internal clock signal ILK.

Figure 15:
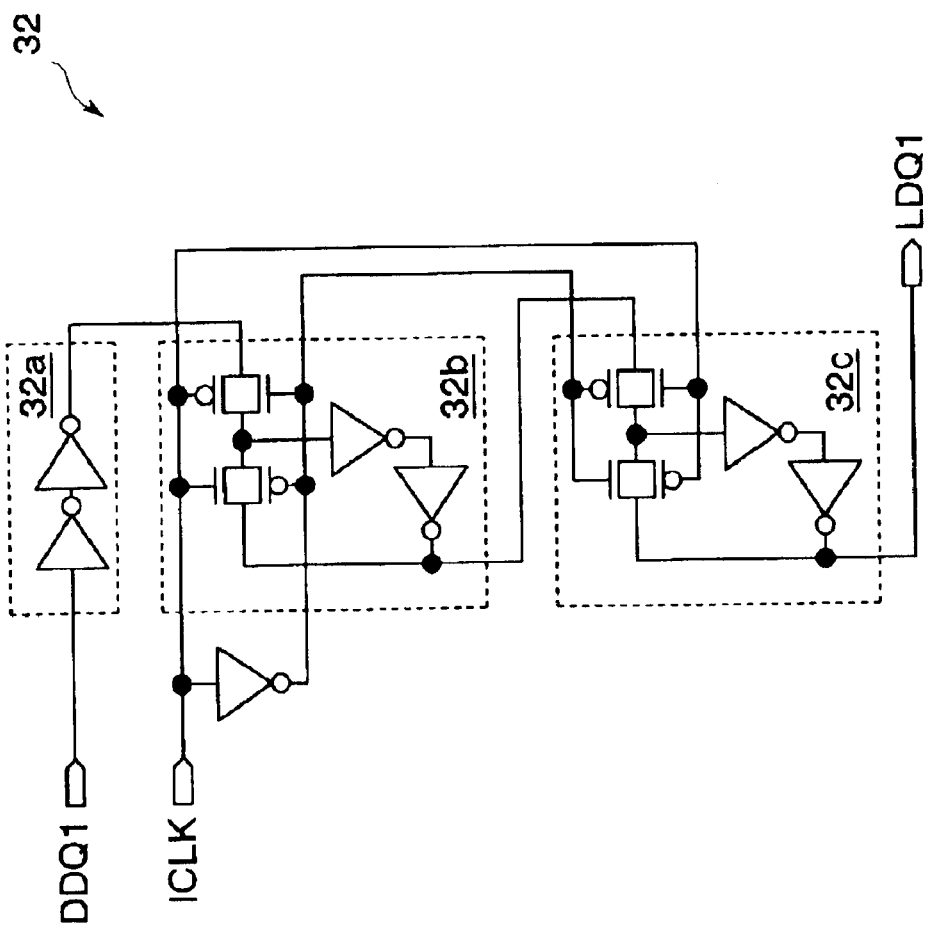
FIG. 15 is a circuit diagram showing the details of a latch circuit of FIG. 14.

FIG. 15 shows the details of each latch circuit 32 shown in FIG. 14. With reference to FIG. 15, only the latch circuit 32 corresponding to the data signal DQ1 will be explained hereafter.

The latch circuit 32 has a delay stage 32a and latch circuits 32b and 32c. The delay stage 32a delays and outputs the delayed data signal DDQ1 to the latch circuit 32b. The latch circuit 32b transmits the output level of the delay stage 32a to the latch circuit 32c during the low level of the internal clock signal ILK, while it latches the output level of the delay stage 32a during the high level of the internal clock signal ILK.

The latch circuit 32c outputs, as the latched data signal LDQ1, the output level of the latch circuit 32b during the high level of the internal clock signal ILK, while it latches the output level of the latch circuit 32b during the low level of the internal clock signal ILK.

Figure 16:
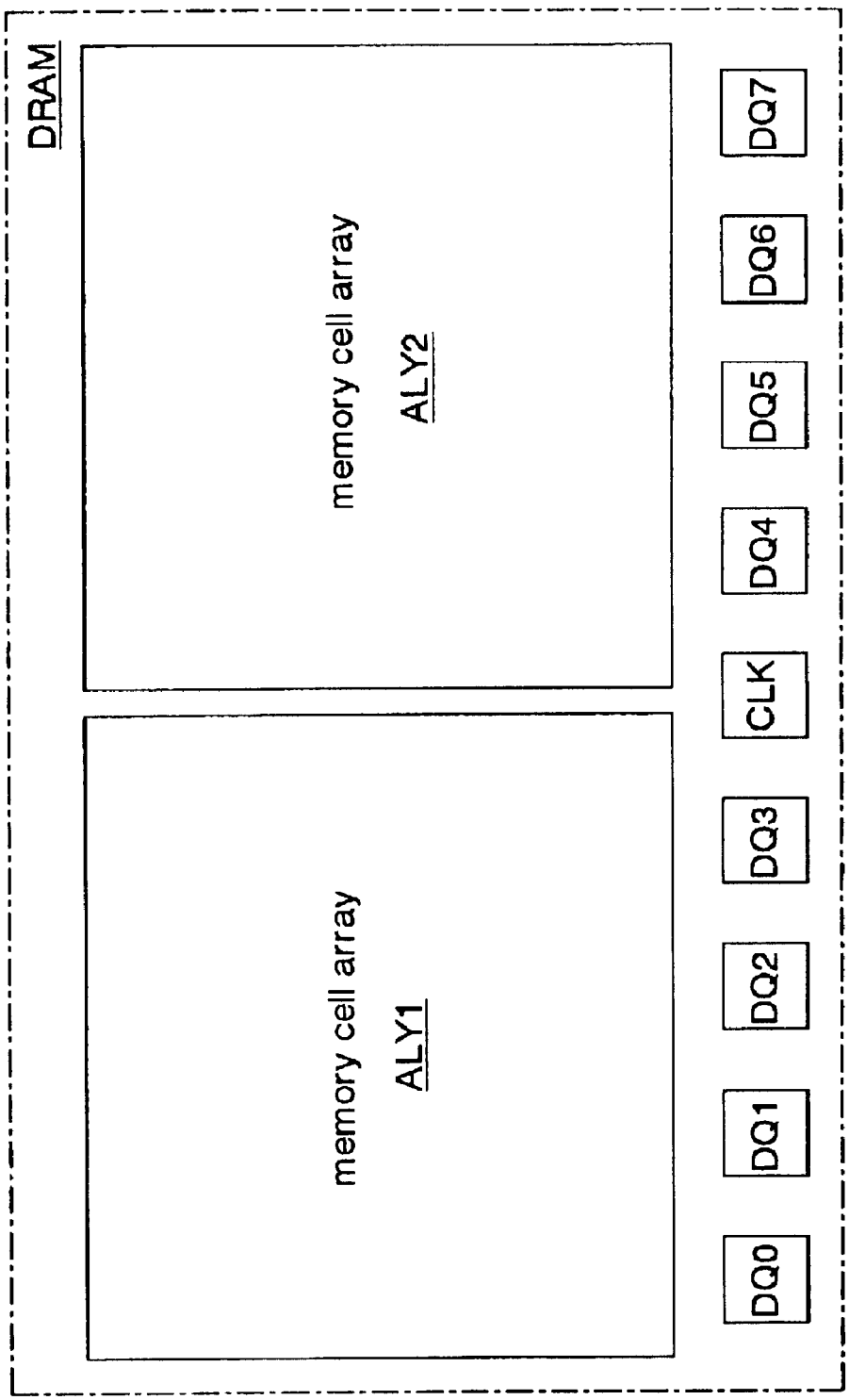
FIG. 16 is a block diagram showing the outline of the chip layout of the DRAM of the fifth embodiment.

FIG. 16 shows a general outline of the chip layout of the DRAM of the fifth embodiment.

The DRAM of the present embodiment has a memory cell array ALY1 for storing the data signals DQ0–DQ3 and a memory cell array ALY2 for storing the data signals DQ4–DQ7. The external terminals for receiving the data signals DQ0–DQ3 are formed along the memory cell array ALY1, while the external terminals for receiving the data signals DQ4–DQ7 are formed along the memory cell array ALY2. The external terminal for receiving the clock signal CLK is formed in the center of the external terminal row for receiving the data signals DQ0–DQ7.

Wire paths for transmitting the data signals DQ0–DQ3 from the associated external terminals to the memory cell array ALY1 are adjacent to each other. Wire paths for transmitting the data signals DQ4–DQ7 from the associated external terminals to the memory cell array ALY2 are also adjacent to each other. The wire paths adjacent to each other provide substantially equal delay times in propagation of the data signals. For this reason, even though the decision circuits 16 and delay adjustment circuits 18 are used in common to the data signals propagated along the adjacent wire paths, the delay times in the variable delay circuits 14 are correctly adjusted. The use of the decision circuits 16 and delay adjustment circuits 18 in common can reduce the layout size of the receiver circuits 30.

The fifth embodiment can obtain the same effects as the foregoing first embodiment. Additionally, in the fifth embodiment, since the decision circuits 16 and delay adjustment circuits 18 were used in common to the data signals propagated along the adjacent wire paths, the layout size of the receiver circuits 30 can be reduced, and hence the chip size of the DRAM can be reduced.

Figure 17:
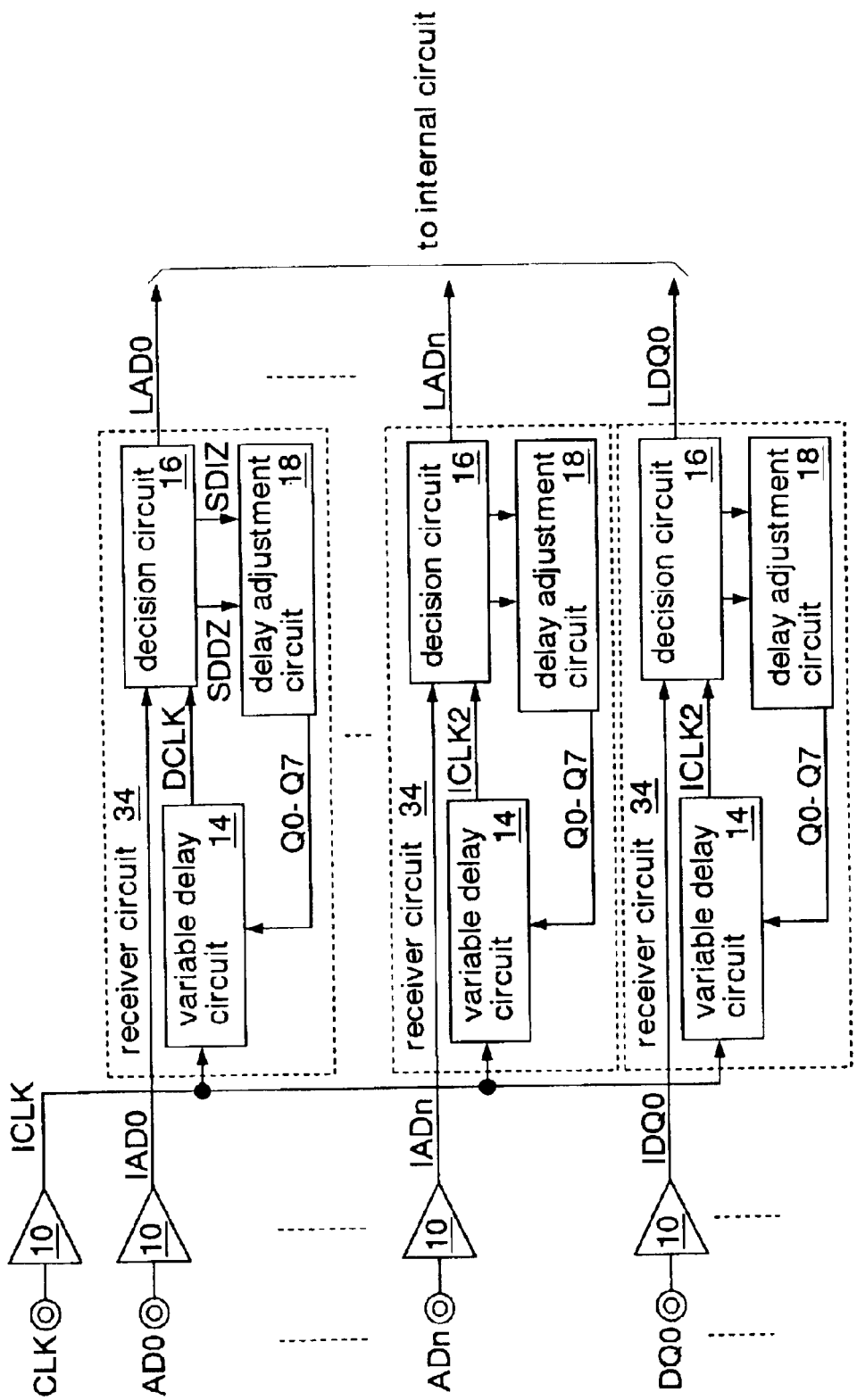
FIG. 17 is a block diagram showing a sixth embodiment of the present invention.

FIG. 17 shows the essential portions of a sixth embodiment of semiconductor integrated circuit according to the present invention. In the sixth embodiment, the same elements corresponding to those described in the first embodiment are identified by the same reference designations, and their detailed descriptions are omitted.

In this sixth embodiment, the DRAM has input buffers 10 that receive the clock signal CLK, address signals AD0–ADn (first input signal) and data signals DQ0–DQn (first input signal) supplied via the respective external terminals, and also has receiver circuits 34 (first receiver circuit) corresponding to the respective address signals AD0–ADn and data signals DQ0–DQn.

The receiver circuits 34 each have a variable delay circuit 14, a decision circuit 16 and the delay adjustment circuit 18. The receiver circuits 34 all have the same structures, and hence only the receiver circuit 34 corresponding to the address signal AD0 will be explained hereafter.

The variable delay circuit 14 of the receiver circuit 34 adjusts the phase of the internal clock signal ILK in accordance with the delay adjustment signals Q0–Q7 and outputs the phase-adjusted signal as a delayed clock signal DCLK.

The decision circuit 16 compares the phase of the delayed address signal DCLK with the phase of the internal address signal IAD0, decides whether to decrease or increase the delay time in the variable delay circuit 14, and outputs the decrease signal SDDZ or the increase signal SDIZ in accordance with the result of the decision. The decision circuit 16 latches the internal address signal IAD0 in synchronization with the delayed clock signal DCLK, and outputs the latched signal as the latched address signal LAD0 to the internal circuit.

The delay adjustment circuit 18 changes the logic levels of the delay adjustment signals Q0–Q7 in accordance with the decrease signal SDDZ or increase signal SDIZ.

Figure 18:
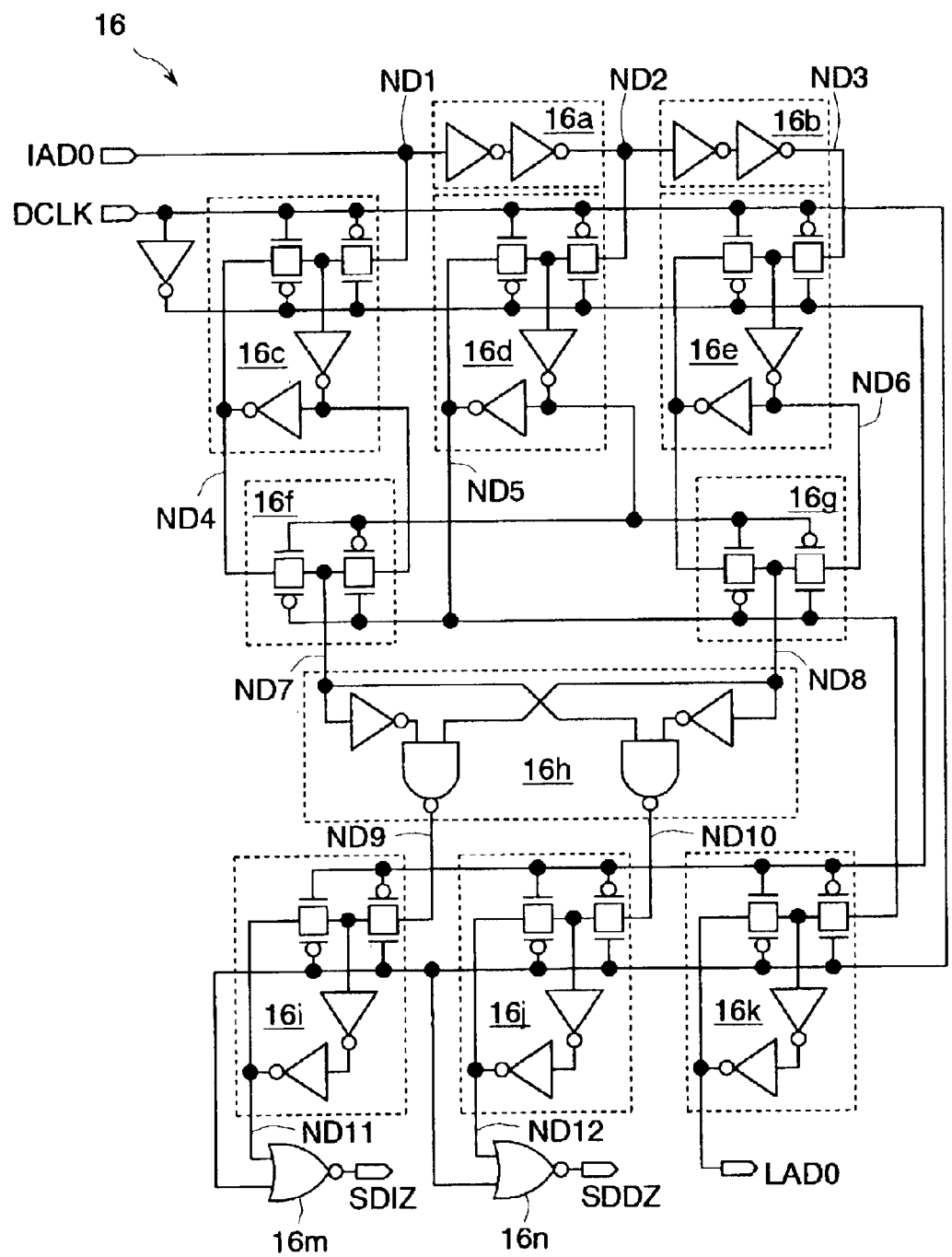
FIG. 18 is a circuit diagram showing the details of a decision circuit of FIG. 17.

FIG. 18 shows the details of the decision circuit 16 corresponding to the address signal AD0 shown in FIG. 17.

The decision circuit 16 is the same as in the first embodiment, but its input and output signals are different from those in the first embodiment. That is, the decision circuit 16 of the present embodiment receives at the node ND1 the internal address signal IAD0, while it also receives the delayed clock signal DCLK. The NOR gates 16m and 16n output the increase signal SDIZ and decrease signal SDDZ, respectively, contrarily to the first embodiment.

Figure 19:
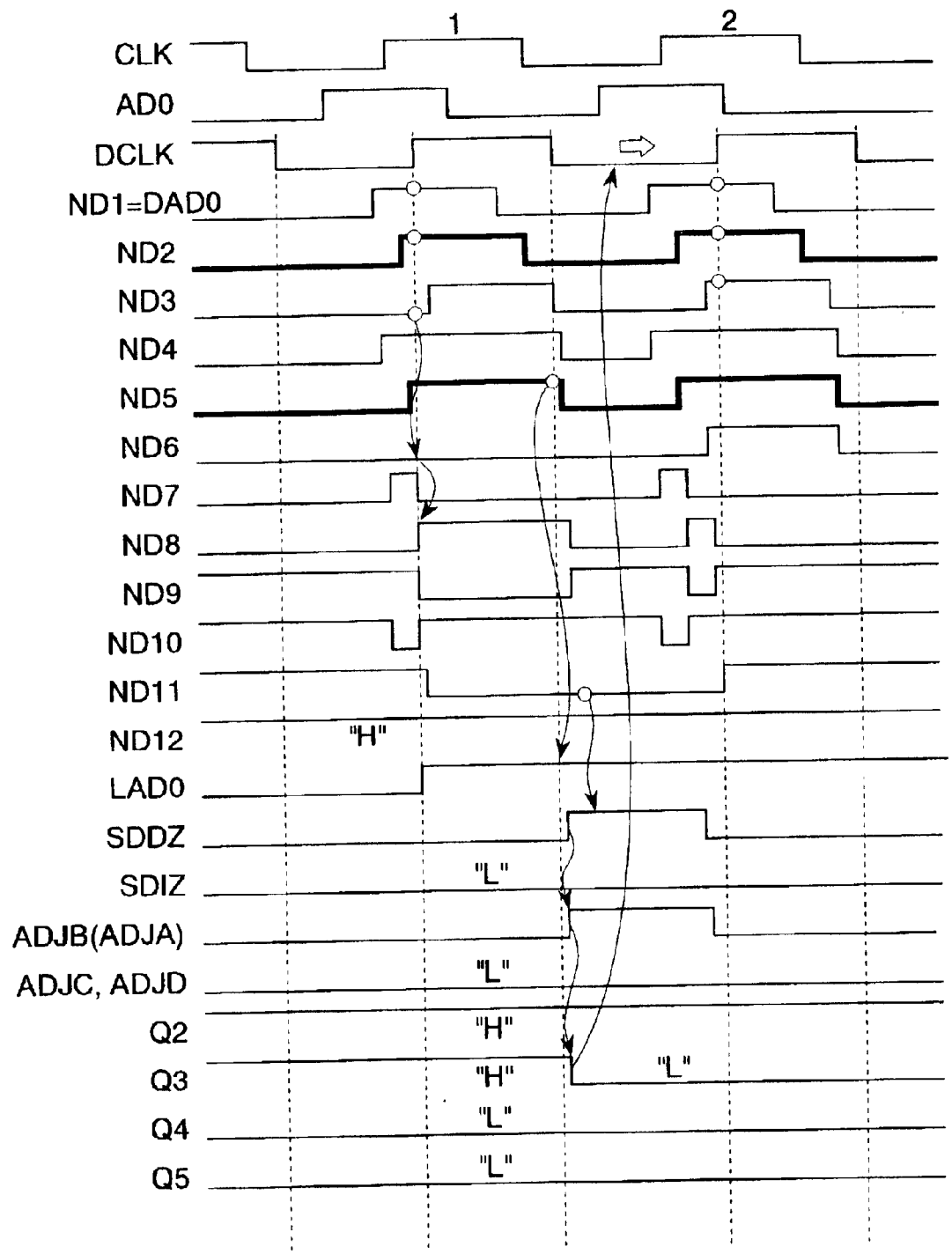
FIG. 19 is a timing diagram showing an operation of a receiver circuit of the sixth embodiment.

FIG. 19 shows the operation of the receiver circuit 34 in a case where the delay of the address signal AD0 is greater than that of the clock signal CLK within the DRAM. In the present embodiment, when the increase signal SDIZ is outputted, the delay time in the variable delay circuit 14 shown in FIG. 17 is elongated, and hence the phase of the delayed clock signal DCLK is delayed. That is, when the delay of the address signal AD0 is greater than that of the clock signal CLK, not the decrease signal SDDZ but the increase signal SDIZ is outputted, whereby the phase of the delayed clock signal DCLK is adjusted. The other operations are the same as those in the first embodiment.

When the delay of the address signal AD0 is smaller than that of the clock signal CLK within the DRAM, the decrease signal SDDZ is outputted, contrarily to the first embodiment (FIG. 7), whereby the phase of the delayed clock signal DCLK is advanced.

The sixth embodiment also can obtain the same effects as the foregoing first embodiment.

Figure 20:
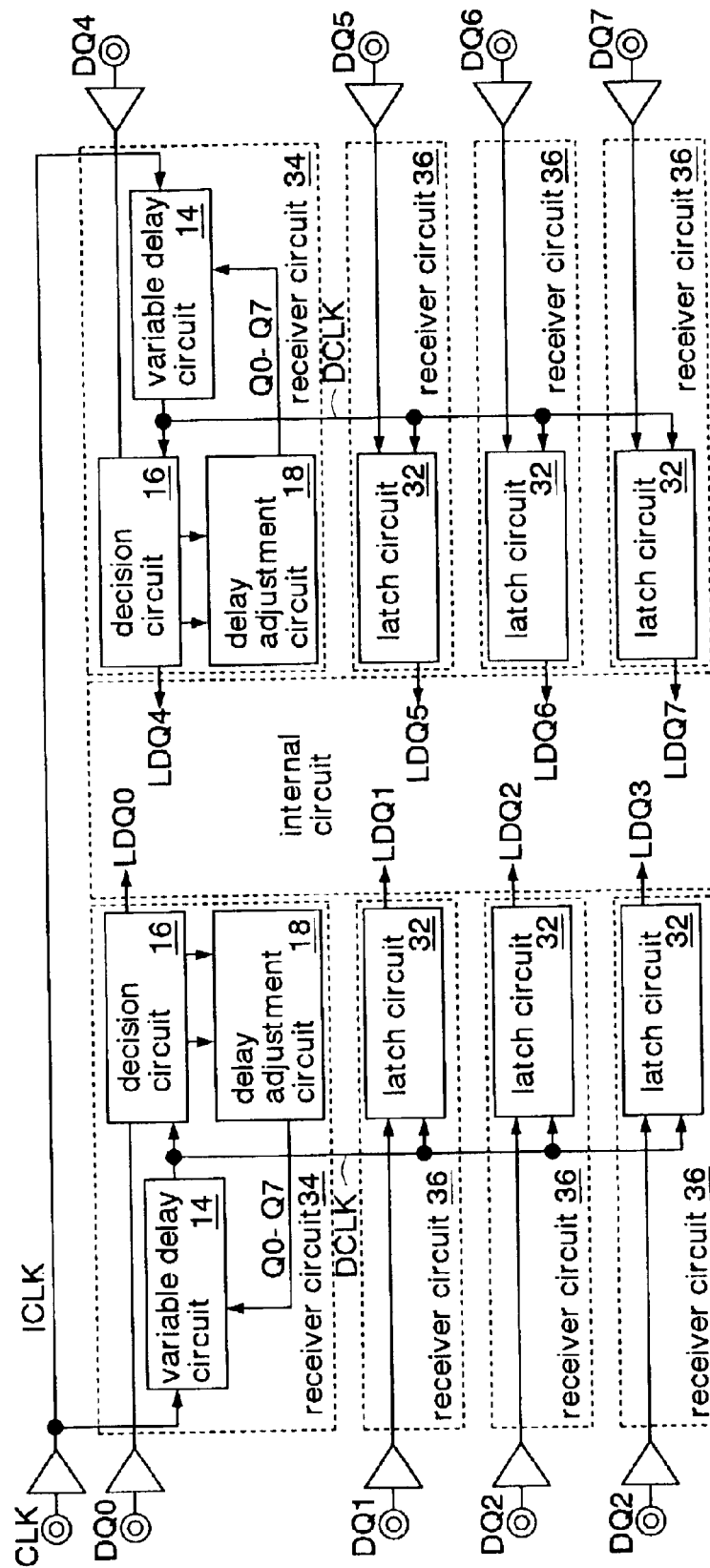
FIG. 20 is a block diagram showing a seventh embodiment of the present invention.

FIG. 20 shows a seventh embodiment of semiconductor integrated circuit according to the present invention. In the seventh embodiment, the same elements corresponding to those described in the first, fifth, and sixth embodiments are identified by the same reference designations, and their detailed descriptions are omitted.

In the seventh embodiment, the DRAM for which the present invention is applied has the same chip layout as in the fifth embodiment (FIG. 16) and also has eight data terminals for receiving the 8-bit data signals DQ0–DQn as in the fifth embodiment. In the present embodiment, the receiver circuits 34 (first receiver circuit) are formed corresponding to the respective data signals DQ0 and DQ4 (first input signal), while receiver circuits 36 (second receiver circuit) are formed corresponding to the respective data signals DQ1–DQ3 and DQ5–DQ7 (second input signal). The receiver circuits 34 are the same as in the sixth embodiment.

The receiver circuits 36 have the same latch circuits 32 (second latch circuit) as in the fifth embodiment. The latch circuits 32 of the receiver circuits 36 corresponding to the data signals DQ1–DQ3 receive the delayed clock signal DCLK outputted from the variable delay circuit 14 of the receiver circuit 34 corresponding to the data signal DQ0. The latch circuits 32 of the receiver circuits 36 corresponding to the data signals DQ5–DQ7 receive the delayed clock signal DCLK outputted from the variable delay circuit 14 of the receiver circuit 34 corresponding to the data signal DQ4.

In the present embodiment, as in the fifth embodiment, wire paths for transmitting the data signals DQ0–DQ3 from the associated external terminals to the associated memory cell array are adjacent to each other, and wire paths for transmitting the data signals DQ4–DQ7 from the associated external terminals to the associated memory cell array are also adjacent to each other. The use of the variable delay circuits 14, decision circuits 16, and delay adjustment circuits 18 in common to the data signals propagated along the adjacent wire paths can further reduce the layout size of the receiver circuits 36 than that of the receiver circuits 30 of the fifth embodiment.

The seventh embodiment can obtain the same effects as the foregoing first, fifth, and sixth embodiments.

Figure 21:
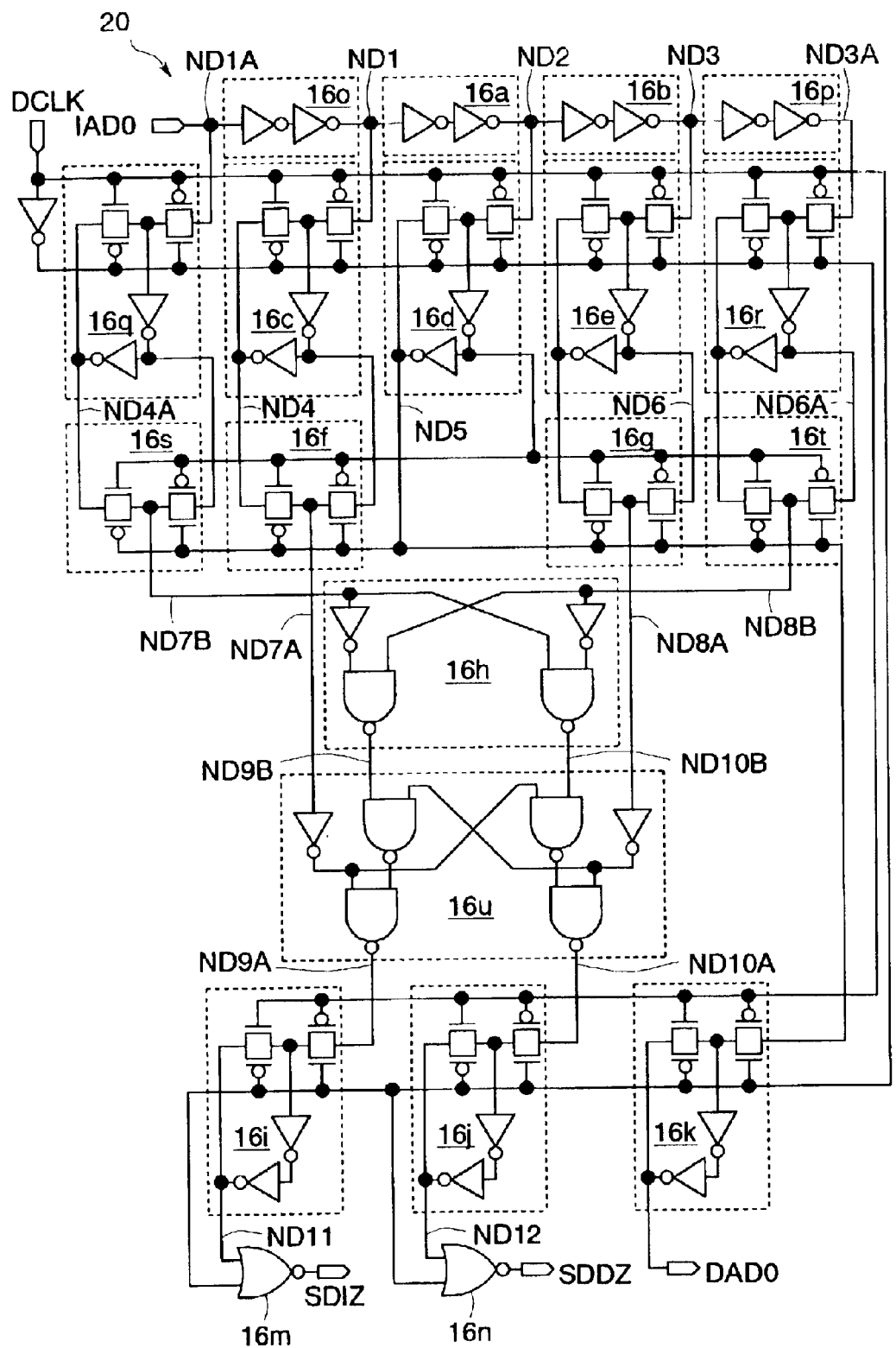
FIG. 21 is a circuit diagram showing the essential portions of an eighth embodiment of the present invention.

FIG. 21 shows the essential portions of an eighth embodiment of semiconductor integrated circuit according to the present invention. In the eighth embodiment, the same elements corresponding to those described in the first, second, and sixth embodiments are identified by the same reference designations, and their detailed descriptions are omitted.

In the eighth embodiment, the decision circuits 20 are formed in place of the decision circuits 16 of the sixth embodiment. The other structures are the same as those in the sixth embodiment (FIG. 17). FIG. 21 shows the decision circuit 20 of the receiver circuit that receives the address signal AD0, but the decision circuits 20 of the receiver circuits that receive the other address signals AD1–ADn and the data signals DQ0–DQn have the same structure as the decision circuit 20 shown in FIG. 21.

The decision circuit 20 is the same as that in the second embodiment, but its input and output signals are different from those in the second embodiment. That is, the decision circuit 20 of the present embodiment receives at the node ND1A the internal address signal IAD0, while it also receives the delayed clock signal DCLK. The NOR gates 16m and 16n output the increase signal SDIZ and decrease signal SDDZ, respectively, contrary to the first embodiment.

The eighth embodiment can also obtain the same effects as the foregoing first, second, and sixth embodiments.

Figure 22:
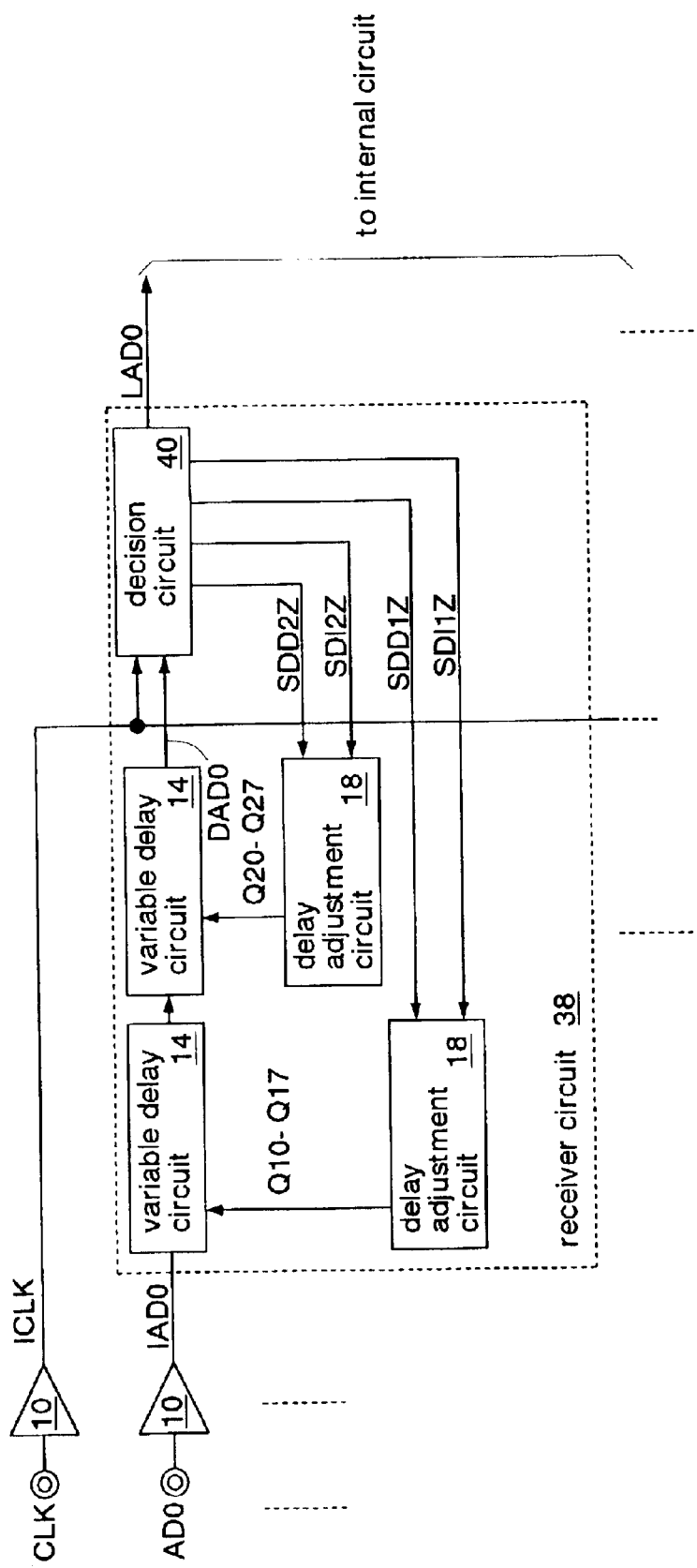
FIG. 22 is a block diagram showing a ninth embodiment of the present invention.

FIG. 22 shows a ninth embodiment of semiconductor integrated circuit according to the present invention. In the ninth embodiment, the same elements corresponding to those described in the first embodiment are identified by the same reference designations, and their detailed descriptions are omitted.

In the ninth embodiment, decision circuits 38 are formed in place of the decision circuits 12 of the first embodiment. The other structures are the same as those in the first embodiment. That is, the DRAM has the input buffers 10 and the receiver circuits 38 that receive the address signal AD0–ADn and the data signals DQ0–DQn. The receiver circuit 38 corresponding to the address signal AD0 will be explained hereafter.

The receiver circuit 38 has two variable delay circuits 14 (first and second variable delay circuits) connected in cascade; a decision circuit 40; and two delay adjustment circuits 18 (first and second delay adjustment circuits) corresponding to the respective variable delay circuits 14.

The internal address signal IAD0 is adjusted in delay time by the two variable delay circuits 14 and is supplied, as the delayed address signal DAD0, to the decision circuit 40. In accordance with the difference in phase between the internal clock signal ILK and the delayed address signal DAD0, the decision circuit 40 outputs at least one of first and second increase signals SDI1Z and SDI2Z or at least one of first and second decrease signals SDD1Z and SDD2Z.

The delay adjustment circuit 18 (first delay adjustment circuit) corresponding to the variable delay circuit 14 that receives the internal address signal IAD0 changes the levels of first delay adjustment signals Q10–Q17 in accordance with the first increase signal SDI1Z or the first decrease signal SDD1Z. The delay adjustment circuit 18 (second delay adjustment circuit) corresponding to the variable delay circuit 14 that outputs the delayed address signal DAD0 changes the levels of second delay adjustment signals Q20–Q27 in accordance with the second increase signal SDI2Z or the second decrease signal SDD2Z. The delay times in the two variable delay circuits 14 are changed in accordance with the levels of the first delay adjustment signals Q10–Q17 and those of the second delay adjustment signals Q20–Q27, respectively.

Figure 23:
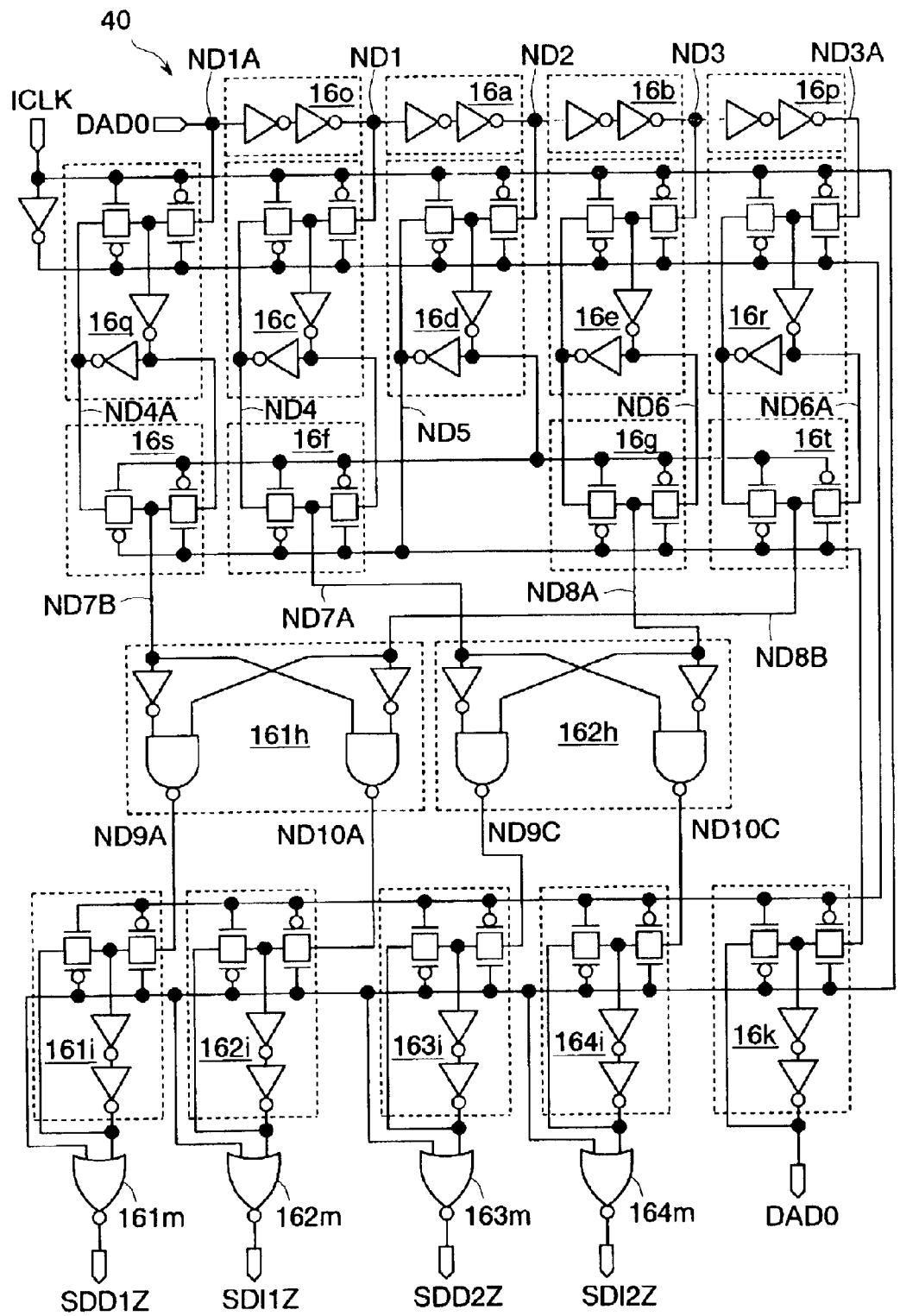
FIG. 23 is a circuit diagram showing the details of a decision circuit of FIG. 22.

FIG. 23 shows the details of the decision circuit 40 shown in FIG. 22.

The decision circuit 40 has the same delay stages 16o, 16a, 16b, and 16p, latch circuits 16q, 16c, 16d, 16e, and 16r and exclusive OR circuits 16s, 16f, 16g, and 16t, and latch circuit 16k as in the second embodiment. The decision circuit 40 also has a comparator 161h for receiving the outputs of the exclusive OR circuits 16s and 16t; a comparator 162h for receiving the outputs of the exclusive OR circuits 16f and 16g; latch circuits 161i, 162i, 163i, and 164i; and NOR gates 161m, 162m, 163m, and 164m.

The latch circuit 161i transmits the level of the output node ND9A of the comparator 161h to the NOR gate 161m. The latch circuit 162i transmits the level of the output node ND10A of the comparator 161h to the NOR gate 162m. The latch circuit 163i transmits the level of the output node ND9C of the comparator 162h to the NOR gate 163m. The latch circuit 164i transmits the level of the output node ND10C of the comparator 162h to the NOR gate 164m.

The NOR gates 161m, 162m, 163m, and 164m output the decrease signal SDD1Z, increase signal SDI1Z, decrease signal SDD2Z, and increase signal SDI2Z in accordance with the levels of the nodes ND9A, ND10A, ND9C, and ND10C, respectively, during the low level of the internal clock signal ILK.

Figure 24:
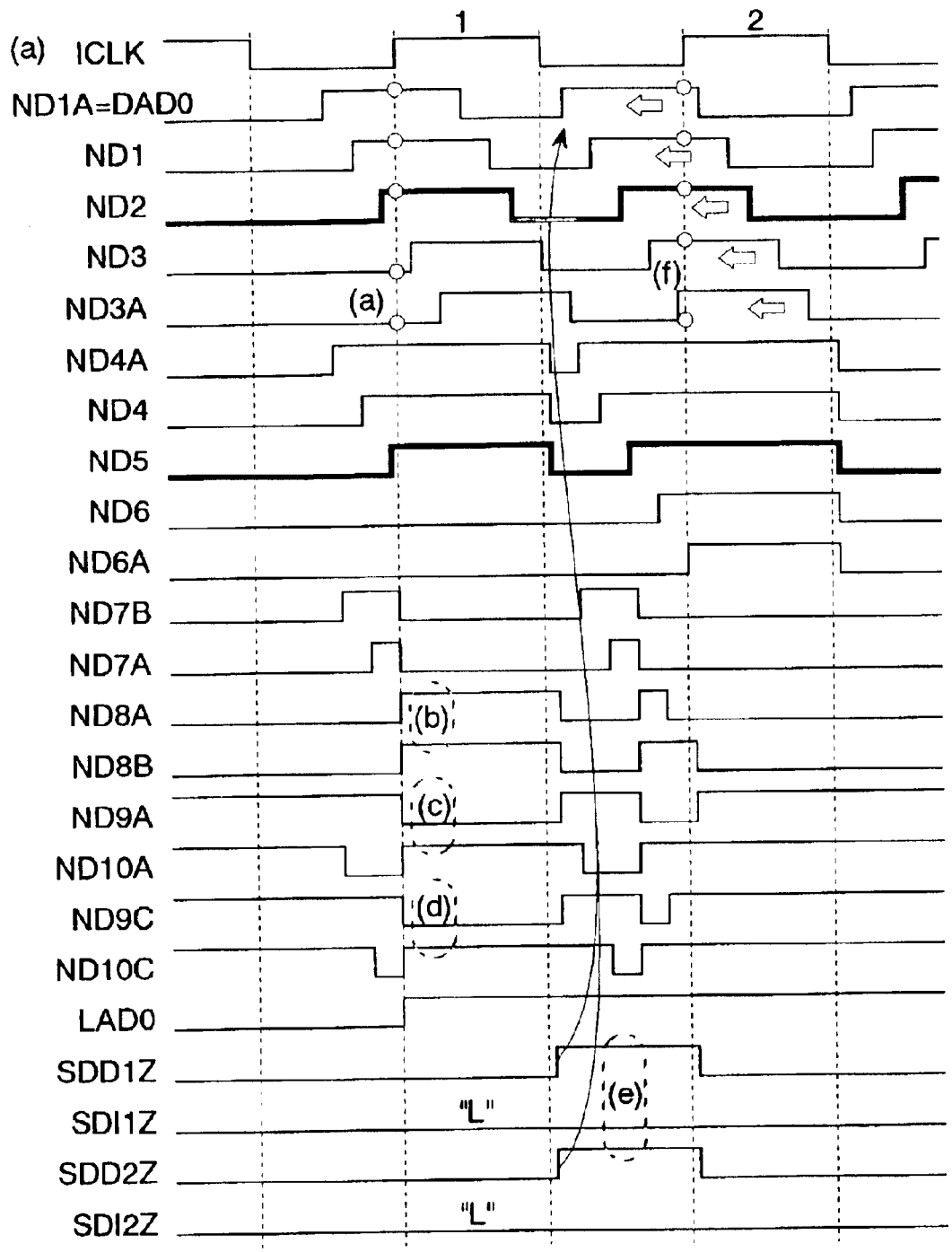
FIG. 24 is a timing diagram showing an operation of a receiver circuit of the ninth embodiment.

FIG. 24 shows an operation in a case where the delay of the address signal AD0 is greater than that of the clock signal CLK within the DRAM. Detailed descriptions of the same operations as in the second embodiment are omitted.

In the present example, the latch circuits 16e and 16r shown in FIG. 23 latch the incorrect address signal AD0 (low level) (FIG. 24(a)). The exclusive OR circuits 16g and 16t output the high levels to the nodes ND8A and ND8B, respectively (FIG. 24(b)).

The comparator 161h receives the low level of the node ND7B and the high level of the node ND8B, and outputs the low level to the node ND9A and the high level to the node ND10A (FIG. 24(c)). The comparator 162h receives the low level of the node ND7A and the high level of the node ND8A, and outputs the low level to the node ND9C and the high level to the node ND10C (FIG. 24(d)). Accordingly, the high levels of the decrease signals SDD1Z and SDD2Z are outputted (FIG. 24(e)).

The outputs of the decrease signals SDD1Z and SDD2Z shorten the delay times in the two variable delay circuits 14, and hence advance the phase of the delayed address signal DAD0 relative to the clock signal. Accordingly, in the second clock cycle, the delayed address signal DAD0 is correctly latched by the latch circuits 16e and 16r (FIG. 24(f)). In the second clock cycle, therefore, the decrease signals SDD1Z and SDD2Z are not outputted. That is, the latch timing adjustment that required two clock cycles in the second embodiment (FIG. 10) can be accomplished in one clock cycle.

Figure 25:
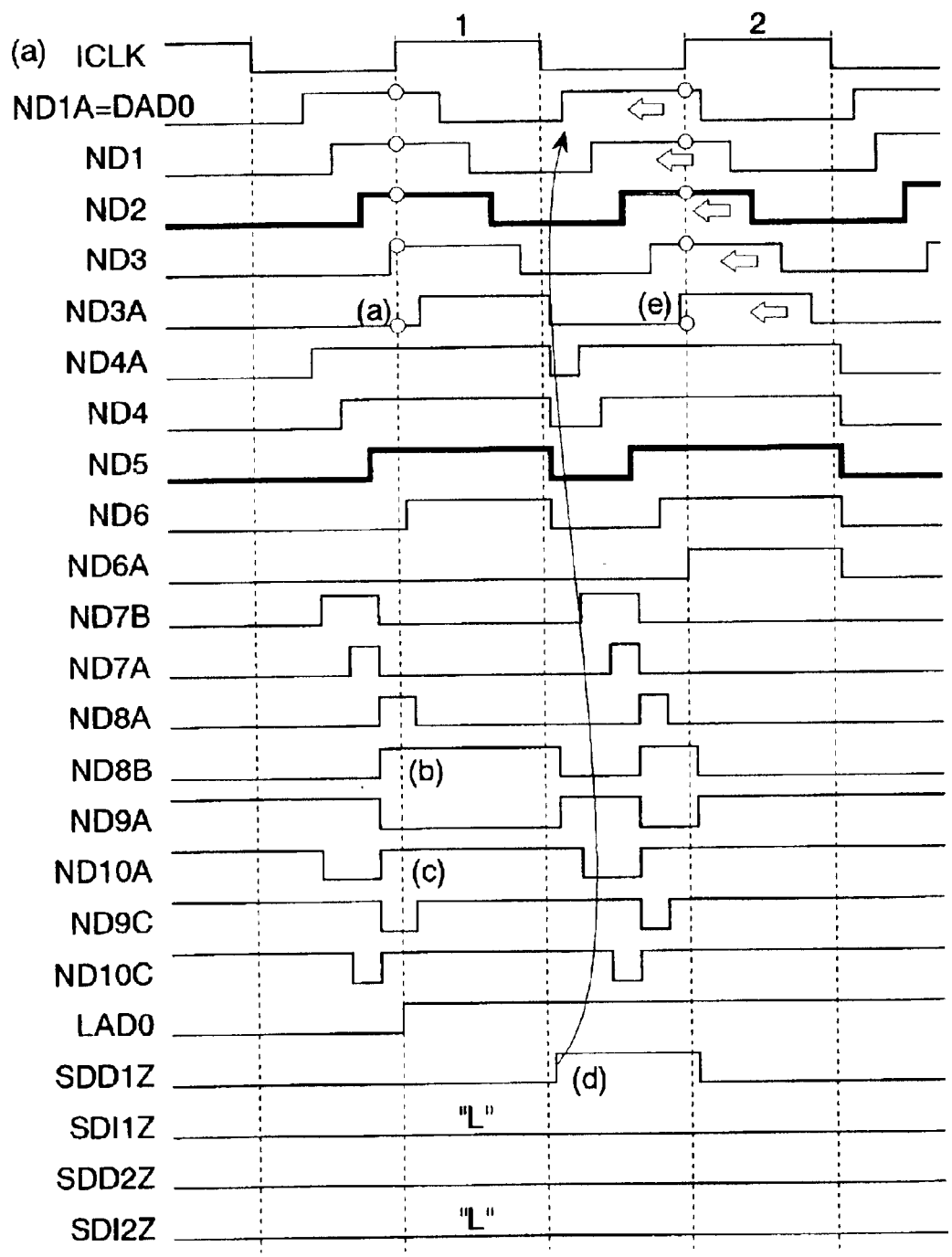
FIG. 25 is a timing diagram showing another operation of the receiver circuit of the ninth embodiment.

FIG. 25 shows another operation in the case where the delay of the address signal AD0 is greater than that of the clock signal CLK within the DRAM. Detailed descriptions of the same operations as in the second embodiment are omitted.

In this example, only the latch circuit 16r shown in FIG. 23 latches the incorrect address signal AD0 (low level) (FIG. 25(a)). The exclusive OR circuit 16t outputs the high level to the node ND8B (FIG. 25(b)).

The comparator 161h receives the low level of the node ND7B and the high level of the node ND8B, and outputs the low level to the node ND9A and the high level to the node ND10A (FIG. 25(c)). Accordingly, the high level of the decrease signal SDD1Z is outputted (FIG. 25(d)).

The output of the decrease signal SDD1Z shortens the delay time in the associated variable delay circuit 14, and hence advances the phase of the delayed address signal DAD0 relative to the clock signal. Accordingly, in the second clock cycle, the delayed address signal DAD0 is correctly latched by the latch circuit 16r (FIG. 25(e)).

Figure 26:
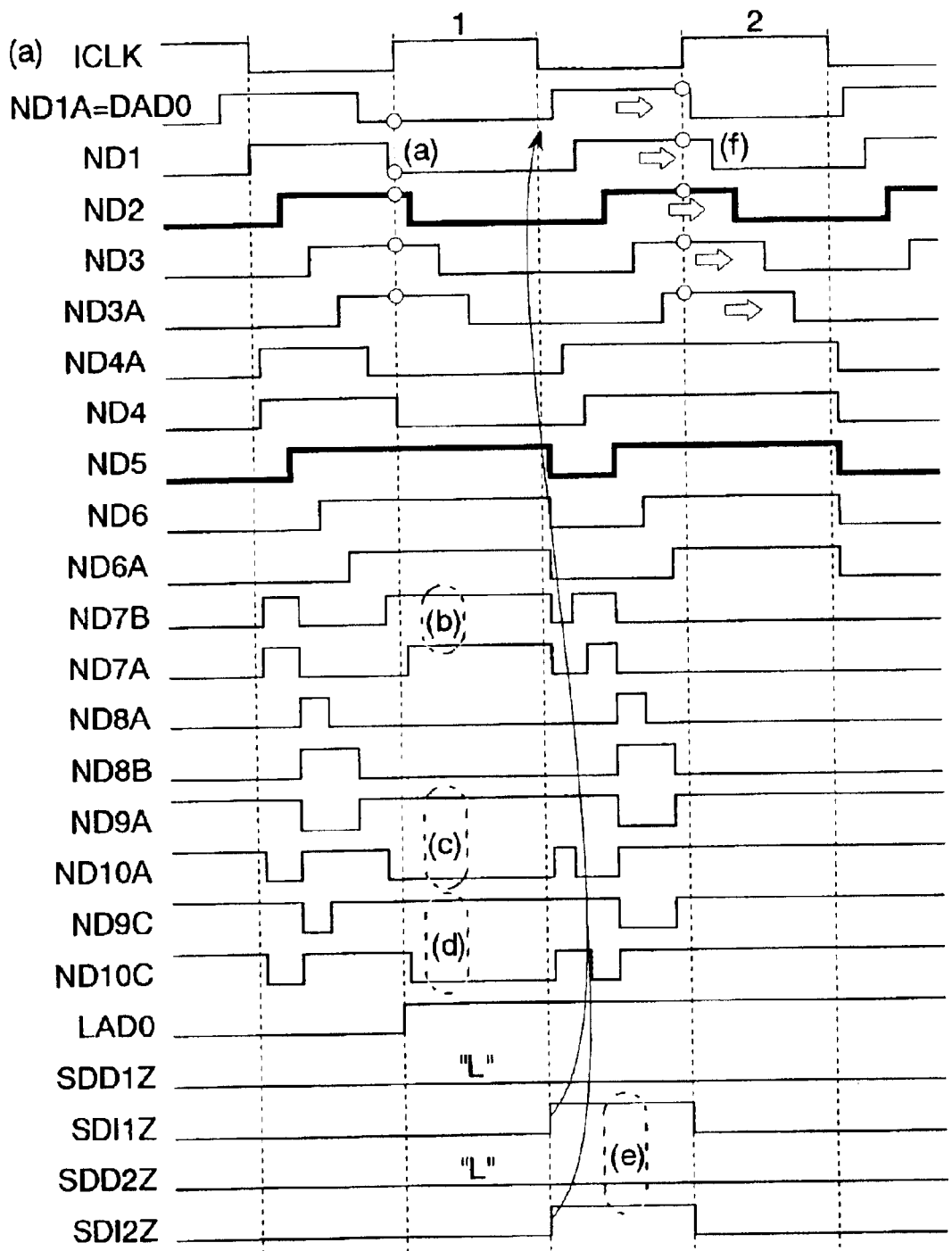
FIG. 26 is a timing diagram showing still another operation of the receiver circuit of the ninth embodiment.

FIG. 26 shows an operation in a case where the delay of the address signal AD0 is smaller than that of the clock signal CLK within the DRAM. Detailed descriptions of the same operations as in the second embodiment are omitted.

In this example, the latch circuits 16q and 16c shown in FIG. 23 latch the incorrect address signal AD0 (low level) (FIG. 26(a)). The exclusive OR circuit 16s and 16f output the high levels to the nodes ND7B and ND7A, respectively (FIG. 26(b)).

The comparator 161h receives the high level of the node ND7B and the low level of the node ND8B, and outputs the high level to the node ND9A and the low level to the node ND10A (FIG. 26(c)). The comparator 162h receives the high level of the node ND7A and the low level of the node ND8A, and outputs the high level to the node ND9C and the low level to the node ND10C (FIG. 26(d)). Accordingly, the high levels of the increase signals SDI1Z and SDI2Z are outputted (FIG. 26(e)).

The outputs of the increase signals SDI1Z and SDI2Z elongate the delay times in the two variable delay circuits 14, and hence delay the phase of the delayed address signal DAD0 relative to the clock signal. Accordingly, in the second clock cycle, the delayed address signal DAD0 is correctly latched by the latch circuits 16q and 16c (FIG. 26(f)). In the second clock cycle, therefore, the increase signals SDI1Z and SDI2Z are not outputted. That is, the latch timing adjustment that required two clock cycles in the second embodiment (FIG. 11) can be accomplished in one clock cycle.

Figure 27:
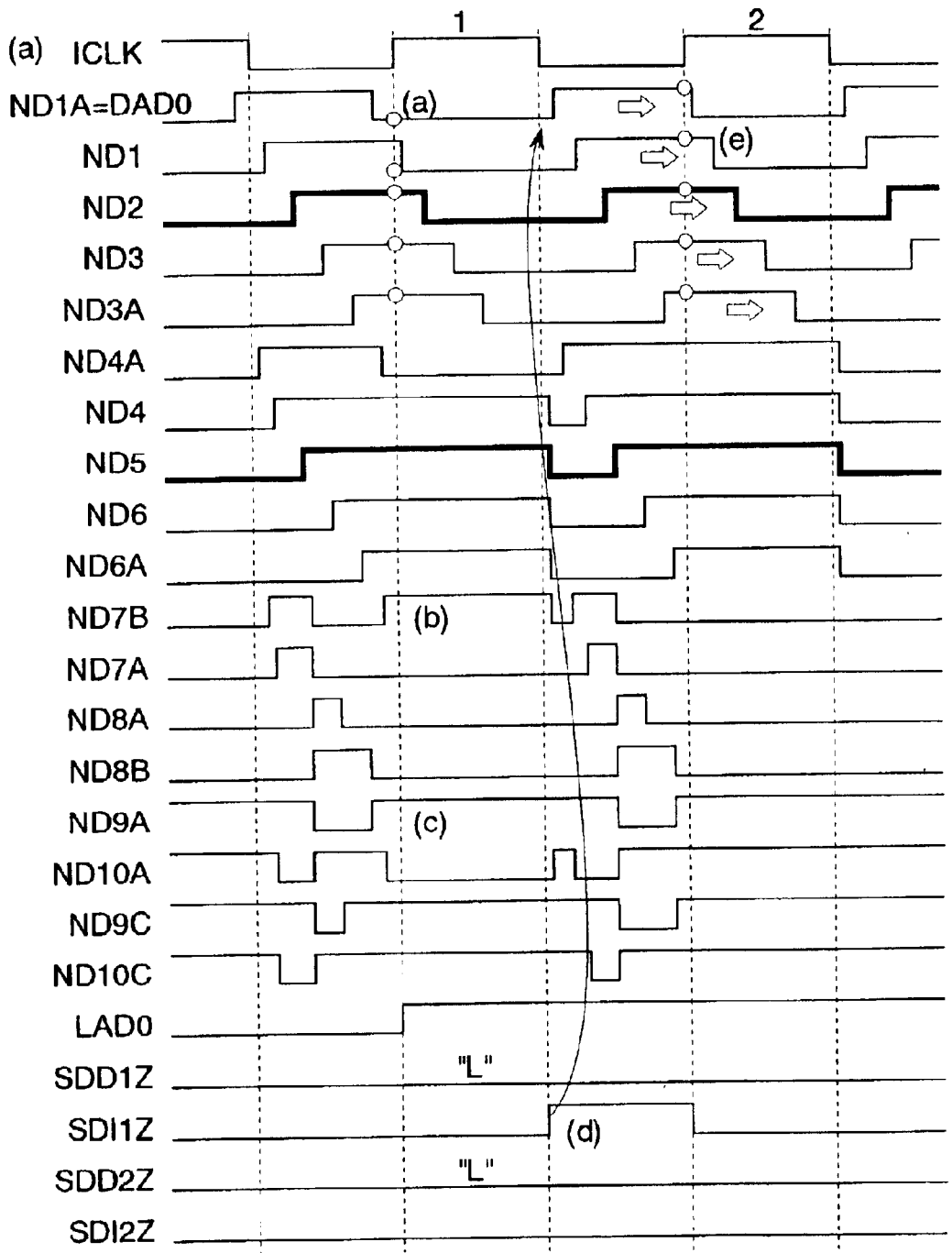
FIG. 27 is a timing diagram showing still another operation of the receiver circuit of the ninth embodiment.

FIG. 27 shows another operation in the case where the delay of the address signal AD0 is smaller than that of the clock signal CLK within the DRAM. Detailed descriptions of the same operations as in the second embodiment are omitted.

In this example, only the latch circuit 16q shown in FIG. 23 latches the incorrect address signal AD0 (low level) (FIG. 27(a)). The exclusive OR circuit 16s outputs the high level to the node ND7B (FIG. 27(b)).

The comparator 161h receives the high level of the node ND7B and the low level of the node ND8B, and outputs the high level to the node ND9A and the low level to the node ND10A (FIG. 27(c)). Accordingly, the high level of the increase signal SDI1Z is outputted (FIG. 27(d)).

The output of the increase signal SDI1Z elongates the delay time in the associated variable delay circuit 14, and hence delays the phase of the delayed address signal DAD0 relative to the clock signal. Accordingly, in the second clock cycle, the delayed address signal DAD0 is correctly latched by the latch circuit 16q (FIG. 27(f)). In the second clock cycle, therefore, the increase signal SDI1Z is not outputted.

The ninth embodiment can obtain the same effects as the foregoing first and second embodiments. Additionally, in the ninth embodiment, when the discrepancy in phase between the clock signal CLK and the address signal AD0 was large, the decision circuit 40 outputted the two decrease signals SDD1Z and SDD2Z or the two increase signals SDI1Z and SDI2Z, thereby simultaneously adjusting the two variable delay circuits 14. Thus, the discrepancy in phase between the clock signal CLK and the address signal AD0 can be eliminated in a short time period.

The foregoing embodiments were described as examples where the present invention was applied for the DRAM. The present invention, however, is not limited to such embodiments. The present invention may be applied for an SRAM, a nonvolatile memory, the logic LSI of a microcomputer or the like, for example. The fifth or seventh embodiment, when applied to the semiconductor integrated circuit having receiver circuits that receive multiple-bit data signals or multiple-bit address signals, could provide significant effects.

The foregoing second, third and eighth embodiments were described as examples where the four cascaded delay stages 16o, 16a, 16b, and 16p were formed, in each decision circuit, thereby sequentially delaying the input signal and where the five latch circuits 16q, 16c, 16d, 16e, and 16r were used to latch the respective delayed input signals. The present invention, however, is not limited to such embodiments. For example, further increased numbers of delay stages and latch circuits would allow the delay time in the variable delay circuit 14 to be more finely adjusted. In such a case, for example, in the second embodiment (FIG. 9), comparators 16u of each decision circuit 20 could be stacked in accordance with such an increased number of the latch circuits.

The invention is not limited to the above embodiments and various modifications may be made without departing from the spirit and scope of the invention. Any improvement may be made in part or all of the components.

What is claimed is:

1. A semiconductor integrated circuit comprising
   a first receiver circuit for receiving a first input signal, which is an address signal or a data signal, in synchronization with a clock signal, wherein said first receiver circuit includes:
   a variable delay circuit that delays said first input signal in accordance with a delay adjustment signal and outputs the delayed signal as a first delay signal;
   a decision circuit that outputs, in accordance with a phase difference between said first delay signal and said clock signal, an increase signal to increase the delay time in said variable delay circuit or a decrease signal to decrease the delay time in said variable delay circuit; and
   a delay adjustment circuit that generates, in accordance with said increase or decrease signal, said delay adjustment signal to adjust said variable delay circuit.

2. A semiconductor integrated circuit comprising
   a first receiver circuit for receiving a first input signal in synchronization with a clock signal, wherein said first receiver circuit includes:
   a variable delay circuit that delays said first input signal in accordance with a delay adjustment signal and outputs the delayed signal as a first delay signal;
   a decision circuit that outputs, in accordance with a phase difference between said first delay signal and said clock signal, an increase signal to increase the delay time in said variable delay circuit or a decrease signal to decrease the delay time in said variable delay circuit; and
   a delay adjustment circuit that generates, in accordance with said increase or decrease signal, said delay adjustment signal to adjust said variable delay circuit, wherein said decision circuit includes:
   a delay circuit that generates a standard delay signal obtained by delaying said first delay signal by a predetermined time, a previous delay signal whose phase is earlier than the phase of said standard delay signal, and a subsequent delay signal whose phase is later than the phase of said standard delay signal;
   a level detecting circuit that detects, in synchronization with said clock signal, an agreement or disagreement in logic level between said standard delay signal and said previous delay signal and an agreement or disagreement in logic level between said standard delay signal and said subsequent delay signal; and
   a delay-time control circuit that outputs said increase signal when a logic level between said standard delay signal and said previous delay signal is in disagreement and outputs said decrease signal when a logic level between said standard delay signal and said subsequent delay signal is in disagreement.

3. The semiconductor integrated circuit according to claim 2, wherein:
   said delay circuit in the decision circuit has delay stages connected in cascade, which receive said first delay signal and sequentially generate said standard delay signal and said subsequent delay signal, said delay circuit outputting, as said previous delay signal, said first delay signal received by an initial delay stage among said delay stages; and
   the delay time of said delay stages is set to the same value.

4. The semiconductor integrated circuit according to claim 2, wherein said decision circuit has a first latch circuit that latches said standard delay signal in synchronization with said clock signal and outputs the latched signal to an internal circuit.

5. The semiconductor integrated circuit according to claim 2, wherein said delay-time control circuit has an inhibiting circuit for inhibiting said increase and decrease signals from being outputted when both of said previous and subsequent delay signals disagree in logic level with said standard delay signal.

6. A semiconductor integrated circuit comprising
   a first receiver circuit for receiving a first input signal in synchronization with a clock signal, wherein said first receiver circuit includes:
   a variable delay circuit that delays said first input signal in accordance with a delay adjustment signal and outputs the delayed signal as a first delay signal;
   a decision circuit that outputs, in accordance with a phase difference between said first delay signal and said clock signal, an increase signal to increase the delay time in said variable delay circuit or a decrease signal to decrease the delay time in said variable delay circuit; and
   a delay adjustment circuit that generates, in accordance with said increase or decrease signal, said delay adjustment signal to adjust said variable delay circuit, wherein said decision circuit includes:
   a delay circuit that generates a standard delay signal obtained by delaying said first delay signal by a predetermined time, a plurality of previous delay signals whose phases are earlier than the phase of said standard delay signal, and a plurality of subsequent delay signals whose phases are later than the phase of said standard delay signal;

a level detecting circuit that detects, in synchronization with said clock signal, an agreement or disagreement in logic level between said standard delay signal and each of said previous delay signals and an agreement or disagreement in logic level between said standard delay signal and each of said subsequent delay signals; and a delay-time control circuit that outputs said increase signal(s) when a logic level between said standard delay signal and any one of said previous delay signals is in disagreement and outputs said decrease signal(s) when a logic level between said standard delay signal and any one of said subsequent delay signals is in disagreement.

7. A semiconductor integrated circuit comprising
a first receiver circuit for receiving a first input signal in synchronization with a clock signal, wherein said first receiver circuit includes;
a variable delay circuit that delays said first input signal in accordance with a delay adjustment signal and outputs the delayed signal as a first delay signal;
a decision circuit that outputs in accordance with a phase difference between said first delay signal and said clock signal, an increase signal to increase the delay time in said variable delay circuit or a decrease signal to decrease the delay time in said variable delay circuit;
a delay adjustment circuit that generates, in accordance with said increase or decrease signal, said delay adjustment signal to adjust said variable delay circuit; and
a mask circuit that outputs said delay adjustment signal generated by said delay adjustment circuit to said variable delay circuit every plurality of clock cycles.

8. A semiconductor integrated circuit comprising
a first receiver circuit for receiving a first input signal in synchronization with a clock signal and a second receiver circuit for receiving a second input signal in synchronization with said clock signal, wherein said first receiver circuit includes:
a variable delay circuit that delays said first input signal in accordance with a delay adjustment signal and outputs the delayed signal as a first delay signal;
a decision circuit that outputs, in accordance with a phase difference between said first delay signal and said clock signal, an increase signal to increase the delay time in said variable delay circuit or a decrease signal to decrease the delay time in said variable delay circuit; and
a delay adjustment circuit that generates, in accordance with said increase or decrease signal, said delay adjustment signal to adjust said variable delay circuit, and wherein said second receiver circuit includes:
a variable delay circuit that delays said second input signal in accordance with said delay adjustment signal generated by said delay adjustment circuit of said first receiver circuit and outputs the delayed signal as a second delay input signal; and
a second latch circuit that latches said second delay input signal in synchronization with said clock signal and outputs the latched signal to an internal circuit.

9. A semiconductor integrated circuit comprising
a first receiver circuit for receiving a first input signal, which is an address signal or a data signal, in synchronization with a clock signal, wherein said first receiver circuit includes:
a variable delay circuit that delays said clock signal in accordance with a delay adjustment signal and outputs the delayed signal as a delay clock signal;
a decision circuit that outputs, in accordance with a phase difference between said delay clock signal and said first input signal, an increase signal to increase the delay time in said variable delay circuit or a decrease signal to decrease the delay time in said variable delay circuit; and
a delay adjustment circuit that generates, in accordance with said increase or decrease signal, said delay adjustment signal to adjust said variable delay circuit.

10. A semiconductor integrated circuit comprising
a first receiver circuit for receiving a first input signal in synchronization with a clock signal, wherein said first receiver circuit includes:
a variable delay circuit that delays said clock signal in accordance with a delay adjustment signal and outputs the delayed signal as a delay clock signal;
a decision circuit that outputs, in accordance with a phase difference between said delay clock signal and said first input signal, an increase signal to increase the delay time in said variable delay circuit or a decrease signal to decrease the delay time in said variable delay circuit; and
a delay adjustment circuit that generates, in accordance with said increase or decrease signal, said delay adjustment signal to adjust said variable delay circuit,
wherein said decision circuit includes:
a delay circuit that generates a standard delay signal obtained by delaying said first input signal by a predetermined time, a previous delay signal whose phase is earlier than the phase of said standard delay signal, and a subsequent delay signal whose phase is later than the phase of said standard delay signal;
a level detecting circuit that detects, in synchronization with said delay clock signal, an agreement or disagreement in logic level between said standard delay signal and said previous delay signal and an agreement or disagreement in logic level between said standard delay signal and said subsequent delay signal; and
a delay-time control circuit that outputs said increase signal when a logic level between said standard delay signal and said previous delay signal is in disagreement and outputs said decrease signal when a logic level between said standard delay signal and said subsequent delay signal is in disagreement.

11. The semiconductor integrated circuit according to claim 10, wherein:
said delay circuit in the decision circuit has delay stages connected in cascade, which receive said first input signal and sequentially generate said standard delay signal and said subsequent delay signal, said delay circuit outputting, as said previous delay signal, said first input signal received by an initial delay stage among said delay stages; and
the delay time of said delay stages is set to the same value.

12. The semiconductor integrated circuit according to claim 10, wherein said decision circuit has a first latch circuit that latches said standard delay signal in synchronization with said delay clock signal and outputs the latched signal to an internal circuit.

13. The semiconductor integrated circuit according to claim 10, wherein said delay-time control circuit has an inhibiting circuit for inhibiting said increase and decrease signals from being outputted when both of said previous and subsequent delay signals disagree in logic level with said standard delay signal.

14. A semiconductor integrated circuit comprising a first receiver circuit for receiving a first input signal in synchronization with a clock signal, wherein said first receiver circuit includes:

a variable delay circuit that delays said clock signal in accordance with a delay adjustment signal and outputs the delayed signal as a delay clock signal;

a decision circuit that outputs, in accordance with a phase difference between said delay clock signal and said first input signal, an increase signal to increase the delay time in said variable delay circuit or a decrease signal to decrease the delay time in said variable delay circuit; and a delay adjustment circuit that generates, in accordance with said increase or decrease signal, said delay adjustment signal to adjust said variable delay circuit, wherein said decision circuit includes:
- a delay circuit that generates a standard delay signal obtained by delaying said first input signal by a predetermined time, a plurality of previous delay signals whose phases are earlier than the phase of said standard delay signal, and a plurality of subsequent delay signals whose phases are later than the phase of said standard delay signal;
- a level detecting circuit that detects, in synchronization with said delay clock signal, an agreement or disagreement in logic level between said standard delay signal and each of said previous delay signals and an agreement or disagreement in logic level between said standard delay signal and each of said subsequent delay signals; and
- a delay-time control circuit that outputs said increase signal when a logic level between said standard delay signal and any one of said previous delay signals is in disagreement and outputs said decrease signal when a logic level between said standard delay signal and any one of said subsequent delay signals is in disagreement.

15. A semiconductor integrated circuit comprising a first receiver circuit for receiving a first input signal in synchronization with a clock signal and a second receiver circuit for receiving a second input signal in synchronization with said clock signal, wherein said first receiver circuit includes:

a variable delay circuit that delays said clock signal in accordance with a delay adjustment signal and outputs the delayed signal as a delay clock signal;

a decision circuit that outputs, in accordance with a phase difference between said delay clock signal and said first input signal, an increase signal to increase the delay time in said variable delay circuit or a decrease signal to decrease the delay time in said variable delay circuit; and a delay adjustment circuit that generates, in accordance with said increase or decrease signal, said delay adjustment signal to adjust said variable delay circuit, and wherein said second receiver circuit has a second latch circuit that latches said second input signal in synchronization with said delay clock signal generated by said variable delay circuit of said first receiver circuit and outputs the latched signal to an internal circuit.

16. A semiconductor integrated circuit comprising a receiver circuit for receiving an input signal in synchronization with a clock signal, wherein said receiver circuit includes:

a first variable delay circuit that delays said input signal in accordance with a first delay adjustment signal;

a second variable delay circuit that delays, in accordance with a second delay adjustment signal, said input signal delayed by said first variable delay circuit and outputs the delayed signal as a first delay signal;

a decision circuit that outputs, in accordance with a phase difference between said first delay signal and said clock signal, a first increase signal to increase the delay time in said first variable delay circuit or a first decrease signal to decrease the delay time in said first variable delay circuit, and/or a second increase signal to increase the delay time in said second variable delay circuit or a second decrease signal to decrease the delay time in said second variable delay circuit;

a first delay adjustment circuit that generates, in accordance with said first increase or first decrease signal, said first delay adjustment signal to adjust said first variable delay circuit; and a second delay adjustment circuit that generates, in accordance with said second increase or second decrease signal, said second delay adjustment signal to adjust said second variable delay circuit.

* * * * *